United States Patent [19]
Nakamura et al.

[11] Patent Number: 5,799,104
[45] Date of Patent: Aug. 25, 1998

[54] MASK DEFECT REPAIR SYSTEM AND METHOD

[75] Inventors: Hiroko Nakamura; Kazuyoshi Sugihara; Haruki Komano, all of Yokohama, Japan

[73] Assignee: Kabushiki Kaisha Toshiba, Kawasaki, Japan

[21] Appl. No.: 670,315

[22] Filed: Aug. 22, 1996

[30] Foreign Application Priority Data

Aug. 22, 1995 [JP] Japan ................................. 7-213595
Aug. 19, 1996 [JP] Japan ................................. 8-217282

[51] Int. Cl.$^6$ ................................. G06K 9/00; G03F 9/00
[52] U.S. Cl. ................................. 382/144; 382/149; 430/5; 250/492.2
[58] Field of Search ................................. 382/144, 141, 382/149; 430/5, 30, 311, 321; 364/489, 490, 491; 348/87, 126; 356/237; 250/492.1–492.3

[56] References Cited

U.S. PATENT DOCUMENTS

| | | | |
|---|---|---|---|
| 5,272,116 | 12/1993 | Hosono | 382/144 |
| 5,382,484 | 1/1995 | Hosono | 430/5 |
| 5,464,713 | 11/1995 | Yoshioka et al. | 430/5 |
| 5,481,624 | 1/1996 | Kamon | 382/144 |
| 5,591,970 | 1/1997 | Komano et al. | 250/309 |

FOREIGN PATENT DOCUMENTS

| | | |
|---|---|---|
| 61-88261 | 5/1986 | Japan. |
| 62-66637 | 3/1987 | Japan. |
| 63-141060 | 6/1988 | Japan. |

OTHER PUBLICATIONS

"Mask and Circuit Repair with Focused-Ion Beams," T. D. Cambria et al. Solid State Technoogy; Sep. 1987 pp. 133–136.

*Primary Examiner*—Leo H. Boudreau
*Assistant Examiner*—Bhavesh Mehta
*Attorney, Agent, or Firm*—Oblon, Spiva, McClelland, Maier & Neustadt, P.C.

[57] ABSTRACT

A mask defect repair system which repairs, by irradiating a particle beam, a defect on a mask made of a transparent substrate and a mask material formed on the substrate, includes an imaging beam irradiation unit for two-dimensionally scanning and irradiating the beam for imaging on a surface of the mask, a detector for detecting a first intensity distribution of secondary particles emitted from the surface of the mask by irradiation of the beam for imaging, an image processing unit for performing image processing of at least part of the first intensity distribution of the secondary particles to prepare a second intensity distribution, an image display unit for displaying the first and second intensity distributions as an image, an external input unit for setting, on the image, a desired region to be processed with the beam, an irradiation region determination unit for determining, on the desired region to be processed, a beam irradiation region on the basis of the second intensity distribution, a repair beam irradiation unit for irradiating the beam for a defect repair on the beam irradiation region, and a gas supply unit for supplying an etching gas or a deposition gas to the surface of the mask.

13 Claims, 14 Drawing Sheets

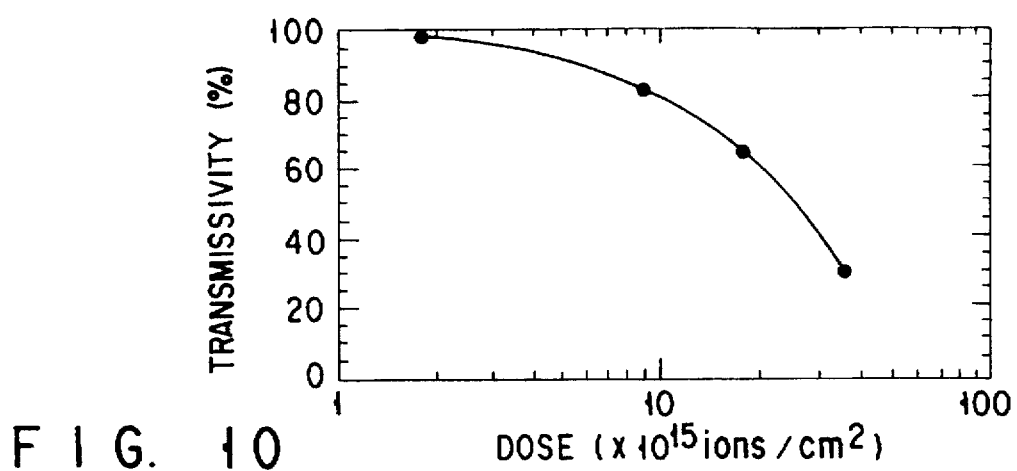
F I G. 10
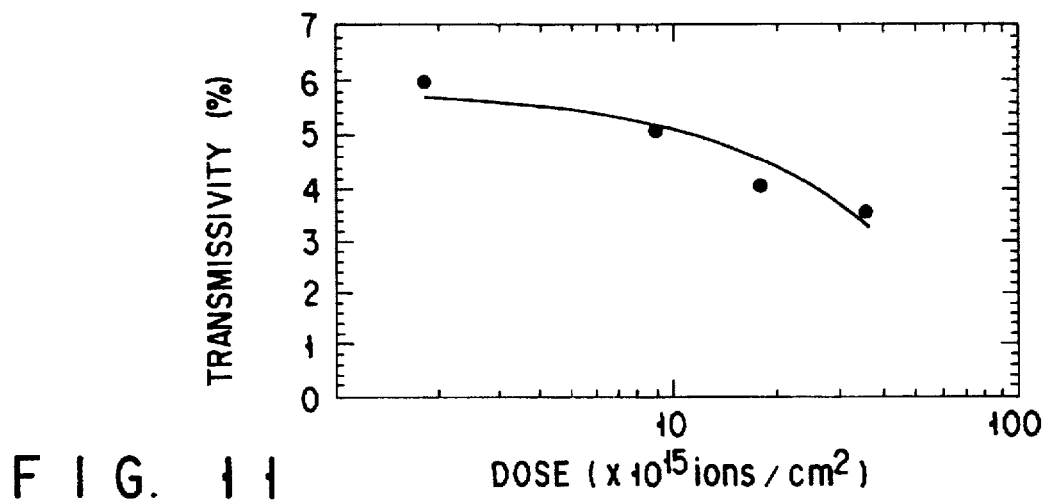
F I G. 11
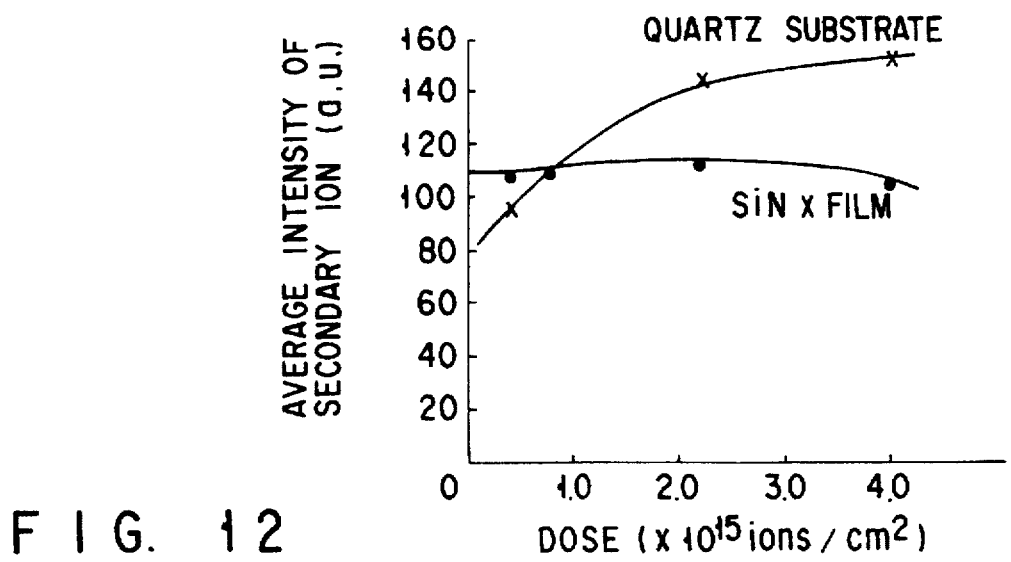
F I G. 12

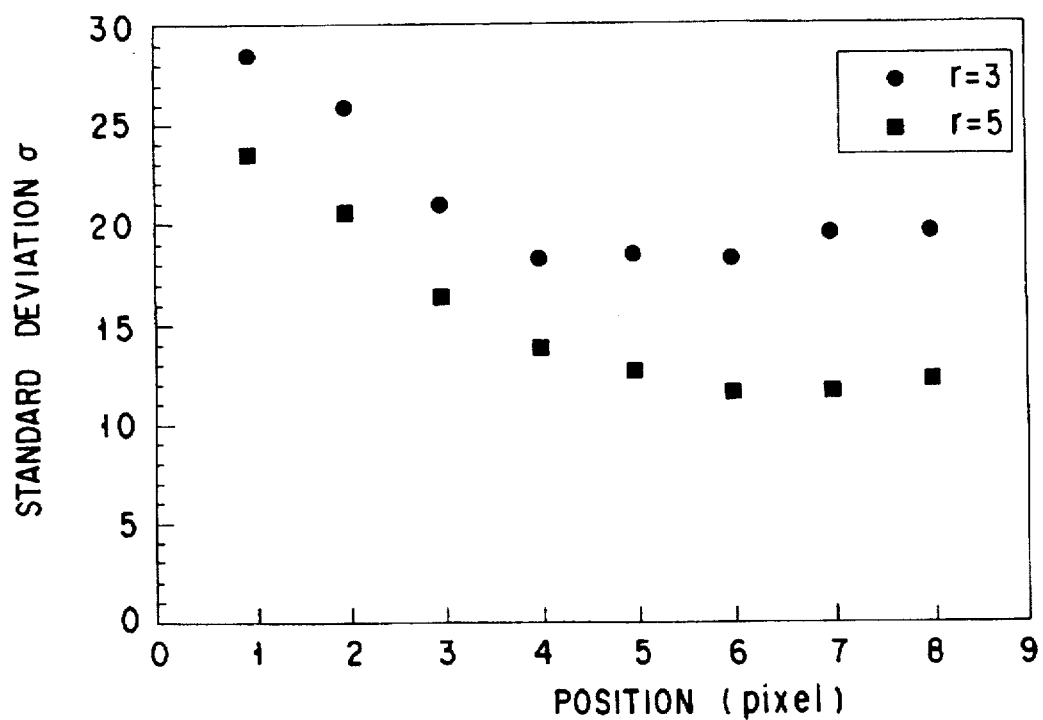
F I G. 17
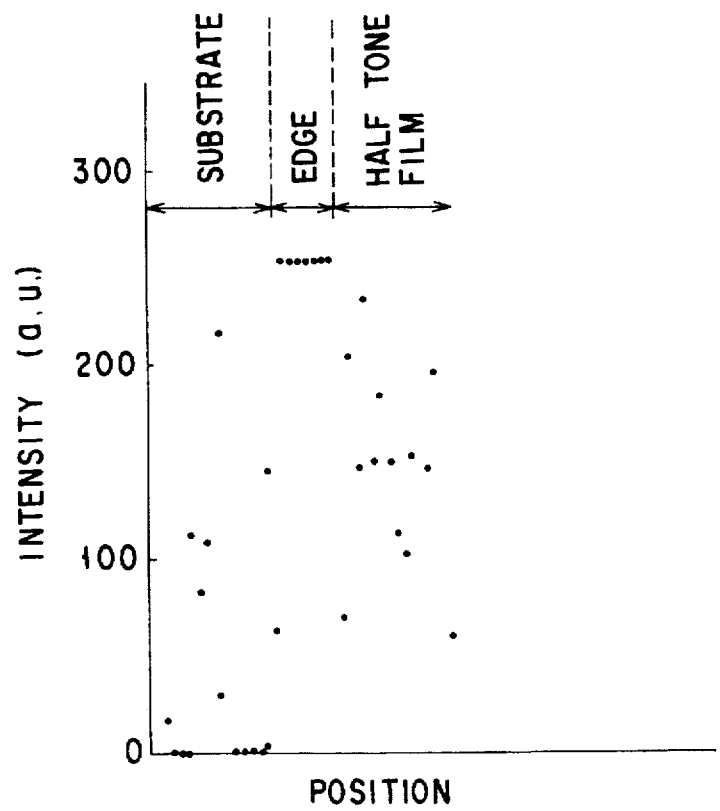
F I G. 18

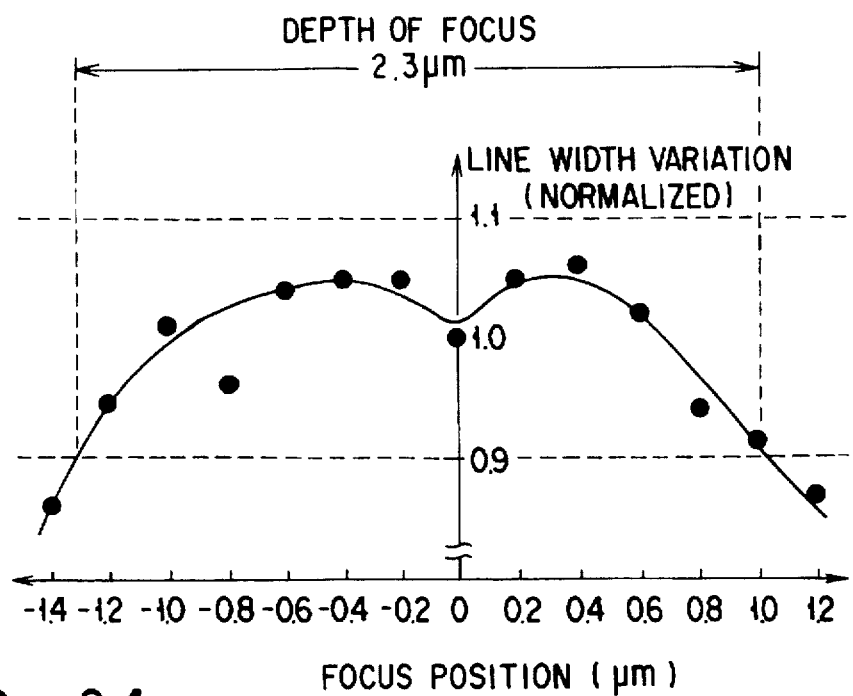
F I G. 24
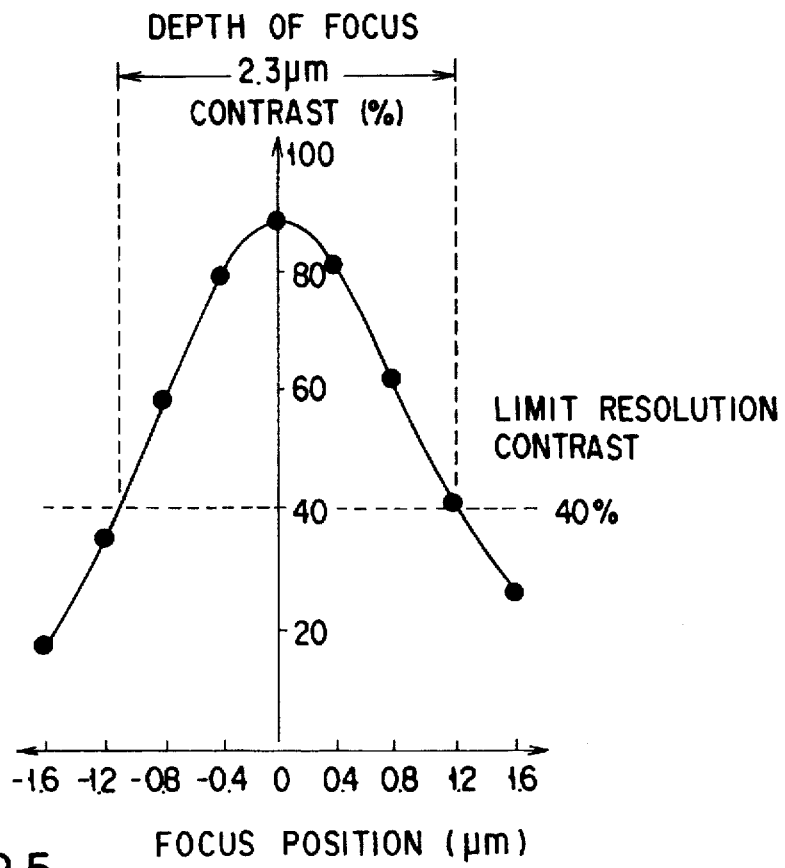
F I G. 25

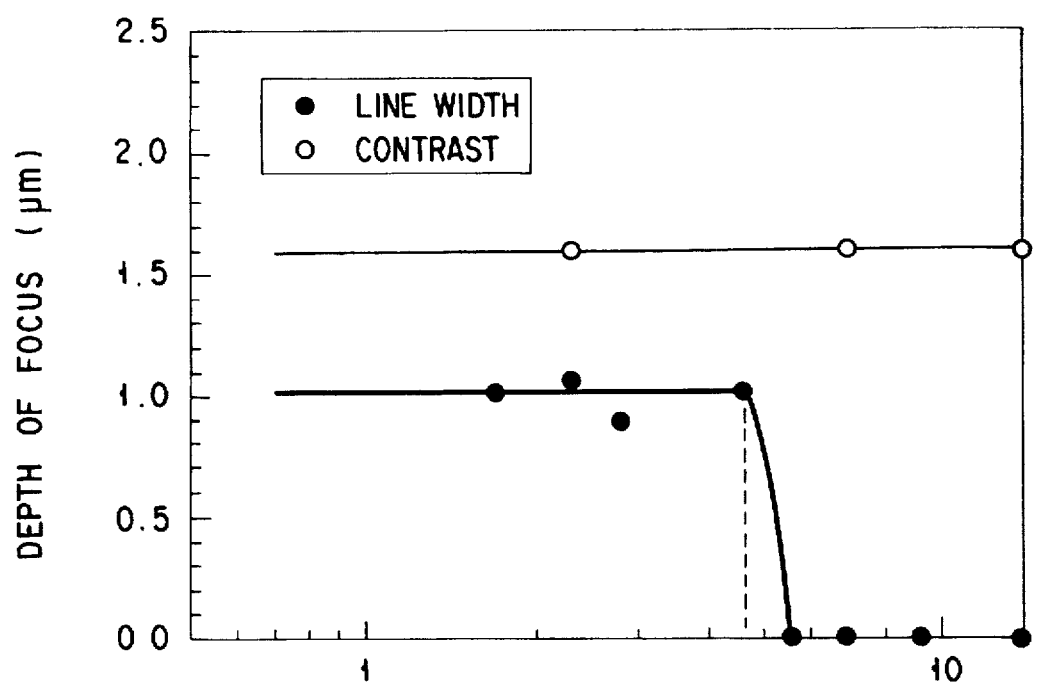
F I G. 30   DOSE ($\times 10^{15}$ ions/cm$^2$)
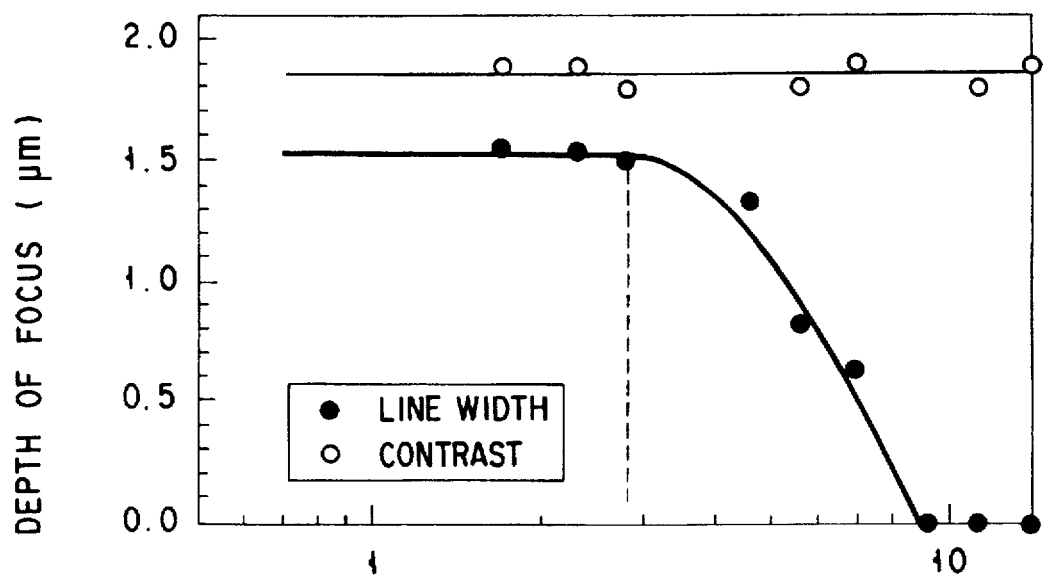
F I G. 31   DOSE ($\times 10^{15}$ ions/cm$^2$)

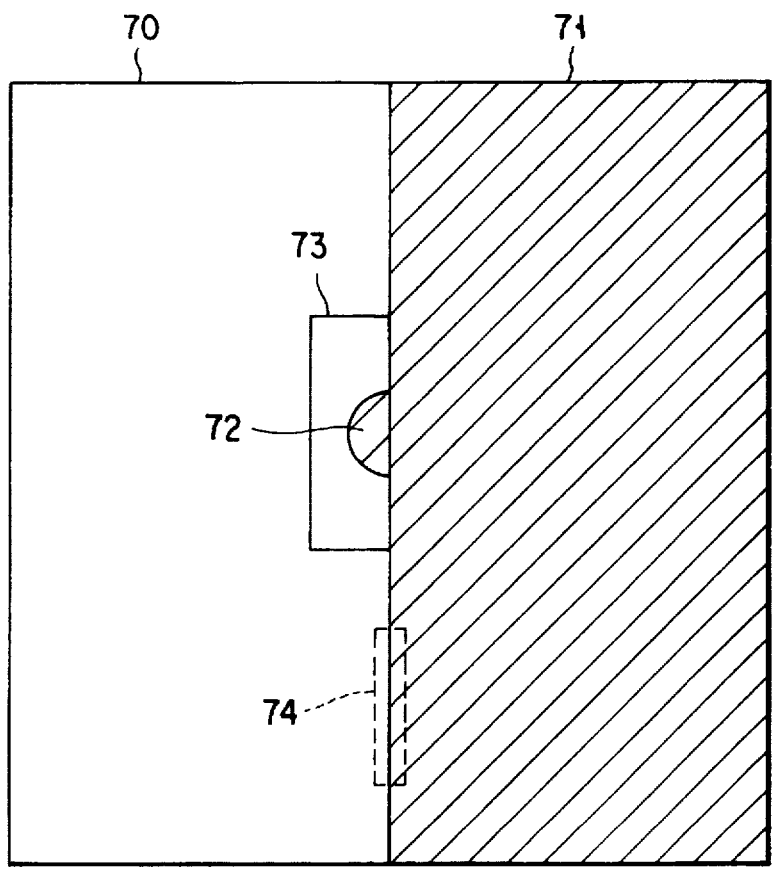
F I G. 32

MASK DEFECT REPAIR SYSTEM AND METHOD

BACKGROUND OF THE INVENTION

1. Field of the Invention

The present invention relates to a lithography technique for forming a micropattern required for an LSI or VLSI and, more particularly, to a mask defect repair system and method for repairing a defect generated on a mask subjected to pattern exposure.

2. Description of the Related Art

A focused ion beam (to be abbreviated as an FIB hereinafter) technique is used as a tool for observing or forming a micropattern because this technique can focus a beam on the order of submicrons.

When the FIB technique is used as a tool for observing a micropattern, imaging of the observation surface is performed with an FIB. This method uses a fact that the emission efficiency of secondary particles which are emitted upon FIB irradiation changes depending on the material and shape of a sample. More specifically, a deflector is used to scan an FIB on the sample surface, and the secondary particle intensity is detected at each scanning point. An image is formed on the basis of the secondary particle intensity obtained at each point.

In this case, for the purpose of removing noise, a simple noise removing method is used. That is, a low-pass filter is applied, or when a scanning operation is to be repeatedly performed, the secondary particle intensity obtained first at each point is integrated with that obtained upon subsequent beam scanning, thereby forming a sharper image.

On the other hand, as a tool for forming a micropattern, an FIB is used to repair a circuit for debugging in LSI development, repair a defect generated on an exposure mask, form a quantum wire, or prepare a transmission electron microscope sample.

Since an FIB is a high-energy beam, the processed sample may be damaged. In etching using an FIB, the selectivity between materials to be etched can hardly be set.

To repair a bump defect (a defect in which an unnecessary film remains) generated on an exposure mask, a method must be developed such that a beam is irradiated on only a defect region conforming to the shape of the bump defect generated on the mask, and the dose is controlled in correspondence with the film thickness of the defect because the shape and thickness of the defect are nonuniform.

As a method of irradiating a beam on only the defect region conforming to the shape of the defect, an adaptive beam blanking method is known, as disclosed in a reference (T. D. Cambria et al. "Mask and Circuit Repair with Focused-Ion Beams", Solid State Technology, p. 113 (1987)). In this method, a particle beam is irradiated on a mask before processing, and an image formed by secondary particles emitted at this time is fetched. A beam is irradiated on only a region where the secondary particle intensity is at a predetermined level or more or at a predetermined level or less, thereby removing the unnecessary substance.

In addition, a method of controlling the beam dose in accordance with the thickness of a defect is disclosed in Jpn. Pat. Appln. KOKAI Publication No. 63-141060, in which a sample surface is divided into small regions, and a beam is irradiated in units of small regions.

As an exposure mask, a mask prepared by forming an opaque film consisting of Cr or MoSi on a quartz substrate having a transmissivity with respect to exposure light is conventionally used. Along with an advance in micropatterning of LSI patterns in recent years, a development associated with a stepper has been made in, e.g., shortening the wavelength of exposure light, increasing an NA (Numerical Aperture), or realizing a modified illumination system. In addition, a phase shifting mask has been developed.

An alternated type phase shifting mask has a conventional structure in which a n opaque film consisting of Cr or MoSi is formed on a quartz substrate. In addition to this structure, a phase shifter is formed to invert the phase of an adjacent opening portion. With this structure, light beams transmitted through adjacent openings interfere with each other, thereby achieving pattern separation.

In a halftone mask, a halftone film is formed on a substrate. A light beam transmitted through the substrate interferes with a light beam transmitted through the halftone film such that these light beams have opposite phases, thereby achieving pattern separation. As the material of the halftone film, $SiN_x$, MoSiO, MoSiON, WSiO, C, Cr, $CrO_x$, Si, or the like is used.

However, when a defect on a phase shifting mask is to be repaired using the FIB technique, the following problems are posed. When an FIB is used as a tool for processing a micropattern, only a simple noise removing method is used, so that noise is included in the image. When the adaptive beam blanking method is to be used to repair a bump defect generated on a mask which has a low contrast between a region where a beam is to be irradiated and a region where the beam is to be blanked, a region which must be irradiated with a beam may not be irradiated and vice versa.

Particularly, as for a halftone mask corresponding to deep UV light (wavelength: 248 nm), the halftone film for obtaining a desired transmissivity and refractive index is formed of an intermediate material between a metal and an insulating material, as disclosed in a reference (S. Itoh at al. "Optimization of optical properties for single-layer halftone masks", SPIE 2197, 99 (1994)), so that the halftone film corresponding to exposure light with a short wavelength is close to an insulating material. For this reason, when imaging by secondary particles is performed for a halftone film corresponding to exposure light having a short wavelength, a contrast difference from the quartz substrate cannot be attained. Therefore, the influence of noise becomes large, resulting in a difficulty in recognizing the material of the defect.

To reduce noise, the number of times of imaging operations is increased, or a dose for one scanning operation is increased to increase the total dose. However, in a repair using an FIB, the sample is damaged by beam irradiation. Consequently, the transmissivity is decreased, and no sufficient light intensity cannot be obtained, so a normal pattern cannot be formed. Even for samples damaged to the same degree, the transmissivity is decreased as the wavelength is shortened. To cope with an advance in micropatterning, the wavelength of a light source tends to become shorter, so this problem becomes more serious.

A problem that various kinds of noise are included in the secondary particle intensity occurs not only during imaging before processing but also during etching end point detection. Particularly, when gas assisted etching is performed to avoid damage caused by beam irradiation, beam irradiation not only activates etching but also eliminates an adsorbed gas. Therefore, to increase the etching rate, the beam irradiation time per pixel must be much shorter than that in imaging. For this reason, the S/N ratio of resultant secondary particles further decreases in etching.

The shape of an FIB is not an ideal rectangle and has an extending intensity distribution (Gaussian distribution). For this reason, a region actually processed does not simply correspond to a beam irradiation position, and the substrate outside the unnecessary portion is undesirably etched. Particularly, in gas assisted etching using an etching gas, a portion outside an actual beam irradiation region is also etched depending on the selected beam condition. In addition, an image corresponding to the edge portion of a film formed on a mask has a width. Therefore, the unnecessary mask material is undesirably left depending on the method of setting a particle beam irradiation region.

Conventionally, when a defect generated on a mask with a low contrast is to be repaired using an FIB, the defect region cannot be properly recognized because the image of the mask formed by beam scanning includes noise. Particularly, when imaging is performed for a halftone mask corresponding to exposure light with a short wavelength by secondary particles, the contrast difference from the quartz substrate cannot be obtained. Consequently, the influence of noise becomes large, resulting in a difficulty in recognizing the material of the defect.

When the number of times of imaging operations is increased or a dose for one scanning operation is increased to reduce noise, the transmissivity of the substrate is decreased, and no sufficient light intensity can be attained, so a normal pattern cannot be formed.

SUMMARY OF THE INVENTION

It is an object of the present invention to provide a mask defect repair system and method, which can properly recognize the region of a defect generated on a mask with a low contrast and particularly on a halftone mask while minimizing noise at a small dose, and repair only the defect region with an FIB.

In order to achieve the above object, according to the first aspect of the present invention, there is provided a mask defect repair system which repairs, by irradiating a particle beam, a defect on a mask made of a transparent substrate and a mask material formed on the substrate, comprising:

imaging beam irradiation means for two-dimensionally scanning and irradiating the particle beam for imaging on a surface of the mask;

detection means for detecting a first intensity distribution of secondary particles emitted from the surface of the mask by irradiation of the particle beam for imaging;

image processing means for performing image processing of at least part of the first intensity distribution of the secondary particles to prepare a second intensity distribution;

image display means for displaying the first and the second intensity distribution as an image composed of a plurality of pixels;

external input means for setting, on the image, a desired region to be processed with the particle beam;

irradiation region determination means for determining, on the desired region to be processed, a particle beam irradiation region on the basis of the second intensity distribution;

repair beam irradiation means for irradiating the particle beam for a defect repair on the particle beam irradiation region; and gas supply means for supplying one of an etching gas and a deposition gas to the surface of the mask.

Preferred embodiments of the present invention are as follows.

(1) The image processing means performs smoothing processing of the intensity of the secondary particles emitted when the particle beam for imaging is scanned on the surface of the mask.

(2) The particle beam irradiation region determination means performs binarization or multi-valued data making of the new intensity distribution prepared by the image processing means while setting a predetermined threshold value, and recognizes a defect portion in the region set by the external input means, thereby determining the particle beam irradiation region.

(3) The particle beam irradiation region determination means performs binarization or multi-valued data making of the new intensity distribution prepared by the image processing means while setting a predetermined threshold value, recognizes a defect portion in the region set by the external input means to determine the particle beam irradiation region, and thereafter, for a boundary portion of the set particle beam irradiation region, sets a new boundary of the particle beam irradiation region on the basis of a predetermined rule in terms of secondary particle intensity near the boundary.

(4) The particle beam irradiation region determination means detects an edge in the region set by the external input means, sets a boundary of the beam irradiation region on the basis of a predetermined rule in terms of secondary particle intensity near the edge, and determines the particle beam irradiation region by designating a region on one side of the boundary by the external input means.

(5) As smoothing processing, a local averaging filter, a local weights averaging filter, a median filter, a variable weights averaging method, a sub-local areas dividing method, or a localized pixel selection method is used.

(6) As a means for setting a threshold value, a method of setting a fixed threshold value in advance, a method of determining/setting a threshold value by an automatic threshold value determination method, or a method of determining/setting a threshold value in units of pixels by dynamic thresholding is used.

(7) When the boundary of the beam irradiation region is to be set, the predetermined rule applied to determine the boundary using secondary particle intensity near the boundary sets a threshold value for the secondary particle intensity to determine the boundary.

(8) When the boundary of the beam irradiation region is to be set, the predetermined rule applied to determine the boundary using secondary particle intensity near the boundary sets the boundary of the beam irradiation region at a position where the secondary particle intensity has a predetermined ratio to the maximum value of the intensity of the secondary particles emitted from the edge portion.

(9) When the boundary of the beam irradiation region is to be set, the predetermined rule applied to determine the boundary using secondary particle intensity near the boundary sets the boundary of the beam irradiation region at a position where the secondary particle intensity reaches a predetermined intensity while the average secondary particle intensity for the substrate or the mask material formed on the substrate is used as a reference.

(10) When the boundary of the beam irradiation region is to be set, the predetermined rule applied to determine the boundary using secondary particle intensity near the boundary sets the boundary of the beam irradiation region at a position separated by a predetermined distance from a position where the intensity of secondary particles emitted from the edge position exhibits the maximum value.

According to the present invention, the first secondary particle intensity distribution for the entire surface is fetched by a computer or the like, and image processing is performed to prepare the second secondary particle intensity distribution file. With this processing, the defect can be properly recognized, so noise can be effectively removed.

Using the newly prepared second secondary particle intensity distribution, a region including the desired processing region is set by an external memory or the like, and the beam irradiation region is determined. With this processing, the desired region can be properly set and processed.

Particularly, by performing smoothing processing as image processing, noise in a signal can be removed even when the contrast between the substrate and the film formed on the substrate is low. Therefore, the materials can be properly discriminated from each other.

For the boundary portion of the temporarily determined particle beam irradiation region or the edge portion of the defect, the boundary of the beam irradiation region is determined on the basis of the predetermined rule, in terms of secondary particle intensity near the boundary or the edge portion. With this processing, only the desired defect region can be repaired.

The imaging beam irradiation means for a semiconductor device of the present invention preferably performs irradiation of the particle beam for imaging at a dose smaller than that at which the secondary particle intensity for the transparent substrate equals that for the mask material.

In this case, preferred embodiments of the imaging beam irradiation means are as follows.

(1) Assume that the mask substrate consists of $SiO_2$, and the film formed on the mask substrate consists of $SiN_x$. In this case, the dose is set at $6\times10^{15}$ ions/cm$^2$ or less when secondary electrons are to be monitored, and at $1\times10^{15}$ ions/cm$^2$ or less when secondary ions are to be monitored.

(2) Assume that the mask substrate consists of $SiO_2$, and the film formed on the mask substrate consists of Cr. In this case, the dose is set at $3\times10^{15}$ ions/cm$^2$ or less when secondary ions are to be monitored.

According to the present invention, imaging is performed at a dose smaller than that at which the secondary particle intensity for the transparent substrate equals that for the mask material formed on the substrate, and image processing is performed for the intensity of the secondary particles obtained by scanning the particle beam on the surface of the mask. With this processing, damage caused by FIB irradiation and noise in the image can be prevented.

The mask defect repair system of the present invention preferably further comprises integration means for dividing the region to be processed with the particle beam into small regions each corresponding to some of the plurality of pixels and integrating, for a predetermined time, secondary particle intensities obtained when the particle beam for the defect repair is being irradiated on the small regions, wherein the repair beam irradiation means stops irradiation of the particle beam for the defect repair to the small regions when an integration results obtained by the integration means reache a predetermined ratio of a predetermined intensity.

According to the present invention, the etching region is divided into small regions, and intensities obtained when the beam is being irradiated on the small regions are integrated for a predetermined time. With this processing, the S/N ratio of the secondary particle or light obtained during etching is improved. When the integration result reaches the predetermined ratio of the predetermined intensity, etching of the small regions is stopped. With this operation, a satisfactory defect repair can be performed even when the thickness of the defect is nonuniform.

The mask defect repair system of the present invention may further comprise arithmetic means for performing image processing of the secondary particle intensities obtained by irradiating the particle beam for the defect repair to prepare a file of a third intensity distribution, and integration means for integrating secondary particle intensities to prepare an integration file, wherein the repair beam irradiation means stops irradiation of the particle beam for the defect repair to the small regions obtained by dividing the region to be processed with the particle beam, each corresponding to some of the plurality of pixels when an integration result obtained by the integration means on the basis of the file of the third intensity distribution prepared by the arithmetic means or arithmetic results in terms of the small regions obtained by the arithmetic means on the basis of the integration file prepared by the integration means reach a predetermined ratio of a predetermined intensity.

According to the present invention, the secondary particle intensity obtained when the beam is being irradiated for etching is fetched by a computer. The secondary particle intensity fetched by the computer is subjected to image processing to prepare a new (third) intensity distribution file. In addition, the secondary particle intensities of the file for the respective pixels are integrated for a predetermined number of times of scanning operations. With this processing, the S/N ratio of the secondary particles or light obtained during etching is improved. When the integration result reaches the predetermined ratio of the predetermined intensity, etching of the corresponding pixel is stopped. With this operation, a satisfactory defect repair can be performed even when the thickness of the defect is nonuniform.

Further, according to the present invention, the secondary particle intensities obtained while the particle beam for etching is irradiated are fetched by a computer and integrated for a predetermined number of times of scanning operations for the respective pixels. The integrated secondary particle intensity is subjected to image processing to prepare a new (third) intensity distribution file, so that the S/N ratio of the secondary particles or light obtained during etching is improved.

In addition, the imaging beam irradiation means irradiates the particle beam within a wide range set by adding at least the radius of an image processing filter to the desired processing region. The detection means can detect a secondary electron intensity distribution within the wide range.

When the secondary electron intensity distribution within the wide range set by adding at least the radius of the image processing filter to the desired processing region is detected, sufficient intensity information for necessary peripheral pixels can be obtained. Since the region can be properly recognized, the substrate can be prevented from being excessively etched, or the defect will not be accidentally left. In addition, since the FIB irradiation region can be minimized, damage to the periphery of the repair region can be prevented, so that the influence on the transfer pattern can be minimized. Furthermore, since the imaging region is minimum, the image size is also minimum, so that the image processing time can be shortened.

The image processing means may correct a drift generated during image processing by detecting the edge of the mask material. With this correction, even when image processing is performed for a long time, the image can be prevented from being shifted from the image obtained first.

According to the second aspect of the present invention, there is provided a mask defect repair system comprising:

imaging beam irradiation means for two-dimensionally scanning and irradiating a particle beam for imaging on a surface of a mask;

detection means for detecting an intensity distribution of secondary particles emitted by irradiation of the particle beam for imaging;

image display means for displaying the intensity distribution of the secondary particles as an image;

external input means for setting, on the image, a desired region to be processed with the particle beam;

irradiation region determination means for determining, on the desired region, a particle beam irradiation region on the basis of the intensity distribution of the secondary particles;

repair beam irradiation means for irradiating a particle beam for a defect repair on the particle beam irradiation region; and gas supply means for supplying one of an etching gas and a deposition gas to the surface of the mask, wherein the irradiation region determination means predicts a shape of a defect edge on the basis of the number of continuous pixels which exhibit a secondary particle intensity equal to or higher than a predetermined level, thereby determining a beam irradiation region and a beam irradiation condition.

According to the present invention, using a fact that the secondary particle intensity for an edge is higher than that for a flat film portion, the shape of the defect edge portion is predicted from the number of continuous pixels which exhibit the secondary particle intensity of the predetermined level or more. The beam irradiation region and the beam irradiation condition are changed for only a portion near the defect edge portion on the basis of the prediction. With this processing, even a nonuniform defect shape can be coped with, so that the substrate can be prevented from being excessively etched, or the mask material will not be excessively left.

According to the third aspect of the present invention, there is provided a mask defect repair system comprising:

imaging beam irradiation means for two-dimensionally scanning and irradiating a particle beam for imaging on a surface of a mask;

detection means for detecting an intensity distribution of secondary particles emitted by irradiation of the particle beam for imaging;

image display means for displaying the intensity distribution of the secondary particles as an image;

external input means for setting, on the image, a desired region to be processed with the particle beam;

irradiation region determination means for determining, on the desired region, a particle beam irradiation region on the basis of the intensity distribution of the secondary particles;

repair beam irradiation means for irradiating a particle beam for a defect repair on the particle beam irradiation region;

gas supply means for supplying one of an etching gas and a deposition gas to the surface of the mask; and dose count means for counting a dose of the particle beam for imaging and/or an effective dose of the particle beam for the defect repair in terms of the processed area.

The particle beam for imaging preferably includes not only a particle beam for defect recognition but also a particle beam for imaging for precise processing. Imaging for precise processing includes imaging for edge locking in which an edge is detected to adjust the processing position, imaging of a corresponding position, which is performed at a predetermined time interval to correct a drift during processing, and imaging for end point detection during processing.

As described above, when the function of counting the FIB dose in each repair process is arranged, it can be determined whether the total FIB dose falls within a dose allowance before processing or upon completion of processing. For this reason, for each processing portion, the dose can be set to be smaller than a dose at which the depth of focus starts to decrease due to FIB irradiation.

According to the present invention, there is provided a mask defect repair method comprising the steps of:

preparing a mask consisting of a transparent substrate and a mask material formed on the substrate;

scanning a particle beam for imaging on the mask to detect a defect position or a work position on the mask; and irradiating a particle beam for a repair to repair a defect, wherein a total dose of the particle beam for imaging and/or an effective dose of the particle beam for the defect repair in terms of the processed area is suppressed within a predetermined dose.

The step of detecting the defect position or the work position preferably includes the step of determining a particle beam irradiation region for a repair on the basis of an intensity distribution of secondary particles emitted by scanning the particle beam for imaging on a surface of the mask, and irradiation of the particle beam for imaging is preferably performed at a dose smaller than that at which a secondary particle intensity for the transparent substrate equals that for the mask material.

In the present invention, the total FIB dose in the repair is set to be smaller than a predetermined value. This set value is determined for each repair portion as follows.

(1) A dose corresponds to an intersection of a depth-of-focus curve determined by a linewidth variation and a depth-of-focus curve determined by a resist contrast when depth-of-focus curves with respect to the total FIB dose are prepared.

(2) A dose at which a depth of focus determined by a linewidth variation starts to decrease.

(3) A dose at which a depth of focus determined by a resist contrast starts to decrease.

The mask material may be translucent with respect to exposure light. More specifically, the mask material may be silicon nitride or a silicon nitride compound.

When the mask material is silicon nitride or a silicon nitride compound, the total FIB dose in a repair must be selected as follows in correspondence with the respective set conditions.

(1) When the latitude in exposure amount is 15%, and the latitude in linewidth is ±15%, the total FIB dose is set at $4.5 \times 10^{15}$ ions/cm$^2$ or less.

(2) When the latitude in exposure amount is 10%, and the latitude in linewidth is ±15%, the total FIB dose is set at $6 \times 10^{15}$ ions/cm$^2$ or less.

(3) When the latitude in exposure amount is 5%, and the latitude in linewidth is ±5%, the total FIB dose is set at $3.5 \times 10^{15}$ ions/cm$^2$ or less.

(4) When the latitude in exposure amount is 10%, and the latitude in linewidth is ±5%, the total FIB dose is set at $4.5 \times 10^{15}$ ions/cm$^2$ or less.

(5) When the latitude in exposure amount is 5%, and the latitude in linewidth is ±10%, the total FIB dose is set at $6 \times 10^{15}$ ions/cm$^2$ or less.

(6) When the latitude in exposure amount is 10%, and the latitude in linewidth is ±10%, the total FIB dose is set at $5 \times 10^{15}$ ions/cm$^2$ or less.

(7) When the latitude in exposure amount is 15%, and the latitude in linewidth is ±10%, the total FIB dose is set at $3 \times 10^{15}$ ions/cm$^2$ or less.

To realize the above method, a mask defect repair system which repairs a defect by irradiating an FIB preferably has a function of counting the FIB dose in each repair process.

According to the present invention, when a defect generated on a mask is to be repaired using an FIB, the total dose is set to be smaller than a predetermined value. With this arrangement, the size of a resist pattern formed on a wafer can be prevented from being adversely affected by damage on the mask.

A depth of focus determined by a linewidth variation is obtained as follows. Linewidth is the width between the points where optical image intensity is above a predetermined threshold value. This depth of focus is the range of focus position where the linewidth falls within an allowance and the exposure amount falls within an allowance. At a depth of focus determined by a resist contrast, the optical image intensity obtains a contrast equal to or higher than the limit resolution contrast of a resist in use. A depth of focus determined by a pattern transfer experiment corresponds to the smaller one of the depth of focus determined by the linewidth variation and the depth of focus determined by the resist contrast. Therefore, when a depth-of-focus curve with respect to the total FIB dose is prepared, and the total FIB dose is set to be equal to or smaller than a dose corresponding to an intersection of the depth-of-focus curve determined by the linewidth variation and the depth-of-focus curve determined by the resist contrast, the size of a resist pattern formed on a wafer can be prevented from being adversely affected by damage on the mask.

Assume that the depth of focus obtained upon pattern transfer experiment is the depth of focus determined by the linewidth variation. In this case, for each repair portion, the total FIB dose is set to be equal to or smaller than a dose at which the depth of focus determined by the linewidth variation starts to decrease. With this arrangement, the size of a resist pattern formed on a wafer can be prevented from being adversely affected by damage on the mask.

Assume that the depth of focus obtained upon pattern transfer experiment is the depth of focus determined by the resist contrast. In this case, for each repair portion, the total FIB dose is set to be equal to or smaller than a dose at which the depth of focus determined by the resist contrast starts to decrease. With this arrangement, the size of a resist pattern formed on a wafer can be prevented from being adversely affected by damage on the mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10 is a graph showing the dependency of the transmissivity (wavelength: 250 nm) of the quartz substrate on the dose;

FIG. 11 is a graph showing the dependency of the transmissivity (wavelength: 250 nm) of the SiN$_x$ film on the dose;

FIG. 12 is a graph showing the dependencies of the average secondary ion intensities for the quartz substrate and the SiN$_x$ film on the dose;

FIG. 17 is a graph showing a change in standard deviation with respect to the distance from the end of the image;

FIG. 18 is a graph showing the relationship between a secondary electron intensity at an edge portion and a position so as to explain the eighth embodiment of the present invention;

FIGS. 19 and 20 are graphs showing the relationship between a secondary electron intensity and a pattern edge shape so as to explain the ninth embodiment, in which FIG. 19 shows a case in which a side wall angle is large, and FIG. 20 shows a case in which the side wall angle is small;

FIG. 24 is a graph showing the linewidth variation of a transfer pattern with respect to a focus position for a 0.35-µm L & S;

FIG. 25 is a graph showing a change in contrast with respect to a focus position for the 0.35-µm L & S;

FIG. 30 is a graph showing a change in depth of focus (the latitude in exposure amount is 10% and the latitude in linewidth variation is ±5%) with respect to the FIB dose for the 0.275-µm L & S;

FIG. 31 is a graph showing a change in depth of focus (the latitude in exposure amount is 15% and the latitude in linewidth variation is ±10%) with respect to the FIB dose for the 0.275-µm L & S; and FIG. 32 is a view showing a state in which a bump defect is generated at a pattern edge so as to explain the 11th embodiment.

DETAILED DESCRIPTION OF THE PREFERRED EMBODIMENTS

The embodiments of the present invention will be described below with reference to the accompanying drawings.

(First Embodiment)

Figure 1:
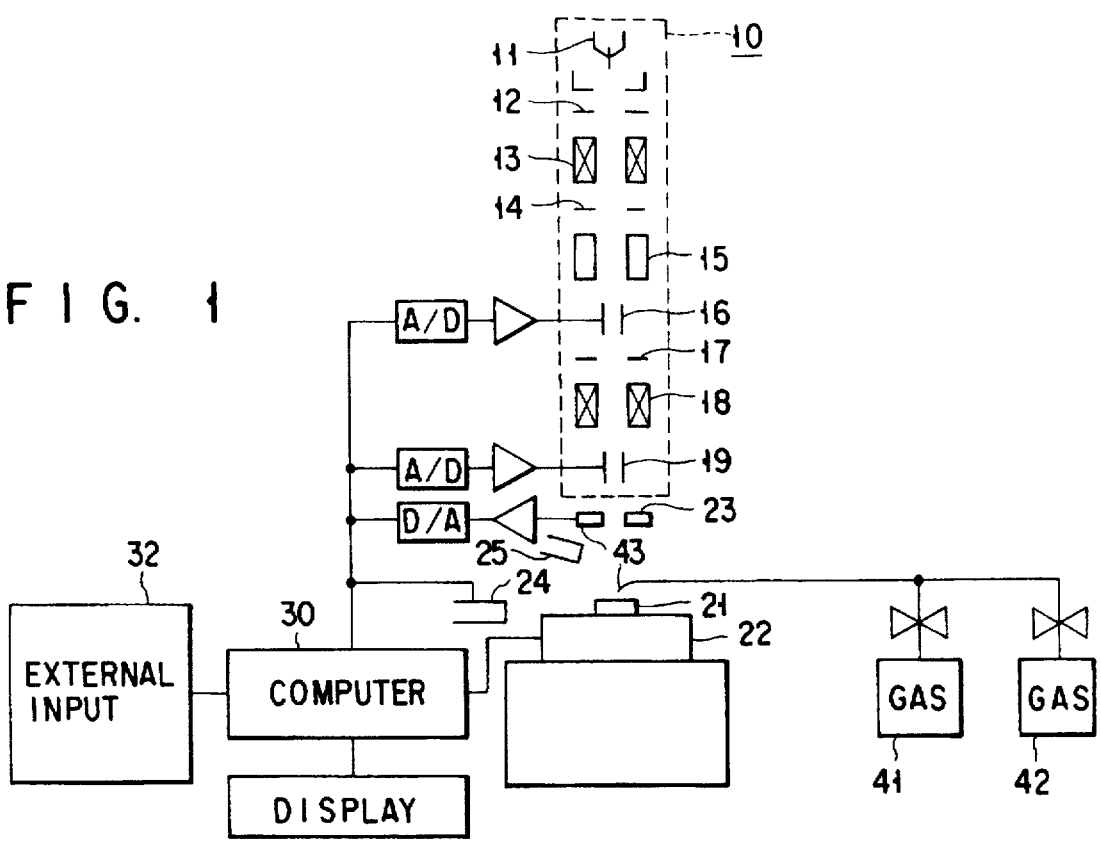
FIG. 1 is a block diagram schematically showing the arrangement of a mask defect repair system according to the first embodiment of the present invention.

FIG. 1 is a block diagram schematically showing the arrangement of a mask defect repair system according to the first embodiment of the present invention.

In FIG. 1, reference numeral 10 denotes a column for generating and scanning an FIB. This column 10 is constituted by an ion source 11, an extraction electrode 12, a magnifying lens 13, a monitor aperture 14, a stigma 15, a blanking electrode 16, a blanking aperture 17, an objective lens 18, a deflecting electrode 19, and the like.

Reference numeral 21 denotes a sample such as a mask; 22, a stage on which the sample is mounted; 23, a microchannel plate for detecting secondary ions from the sample 21; 24, a laser interferometer for measuring the position of the stage 22; 25, a charge neutralizer; 30, a computer for controlling the respective portions; 31, a display; 32, an external input portion; 41 and 42, gas cylinders; and 43, a nozzle.

In this system, an ion beam is extracted from the ion source 11. A voltage to be applied to the blanking electrode 16 or the deflecting electrode 19 is controlled by the computer 30, so that an ion beam is irradiated at a desired position on the sample 21 at a predetermined interval. Secondary particles emitted upon beam irradiation are detected by the microchannel plate 23. The secondary particle intensity for the beam irradiation position is fetched by the computer 30 through an A/D converter and stored in a memory in the computer 30.

The two-dimensional secondary particle intensity distribution stored in the memory is subjected to image processing in the computer 30. As a result, a new secondary particle intensity distribution file is prepared and stored in the memory. The secondary particle intensity distribution is displayed on the display 31 on the basis of this file. A region including a desired processing region is set by the external input portion 32 such as a mouse or a keyboard.

For the region set in this manner, a defect portion is determined on the basis of the newly prepared secondary particle intensity distribution. If a bump defect is detected, a beam irradiation region is set by the computer 30 such that only the defect region is removed. An ion beam is irradiated under the control of the computer to remove the defect region. If a divot defect is detected, a source gas for depositing a thin film is supplied to the sample surface through the nozzle 43. A beam irradiation region is set by the computer 30 such that a thin film can be deposited on only a desired region. A beam is irradiated under the control of the computer 30 to repair the defect region.

The stage position is monitored by the laser interferometer 24. The stage 22 is controlled by the computer 30, so that a variation in stage position caused during processing by the computer 30, such as image processing, is compensated.

In the above-described method, image processing of the secondary particle intensity obtained upon beam irradiation is performed for the entire surface. The secondary particle intensity distribution file is newly prepared and stored in the memory. However, the secondary particle intensity distribution file can also be prepared by performing image processing for only the region set by the external input portion.

A defect repair method using this system will be described below in detail. Particularly, a method of determining a substance formed on the mask by image processing will be described.

Figure 2:
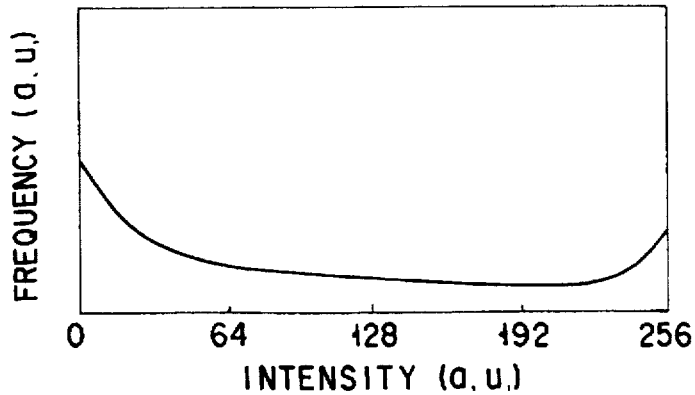
FIG. 2 is a graph showing the relationship between a secondary electron intensity for a halftone mask and its frequency (number of pixels)

FIG. 2 shows the histogram of the number of pixels (frequency) with respect to the intensity of secondary electrons obtained upon imaging a mask with an $SiN_x$ film formed on a quartz substrate. The intensity obtained for the quartz region and the $SiN_x$ region extends due to noise. Since the distribution for the quartz region overlaps the distribution for the $SiN_x$ region, the $SiN_x$ film can hardly be discriminated from the quartz substrate on the basis of the intensity.

Figure 3:
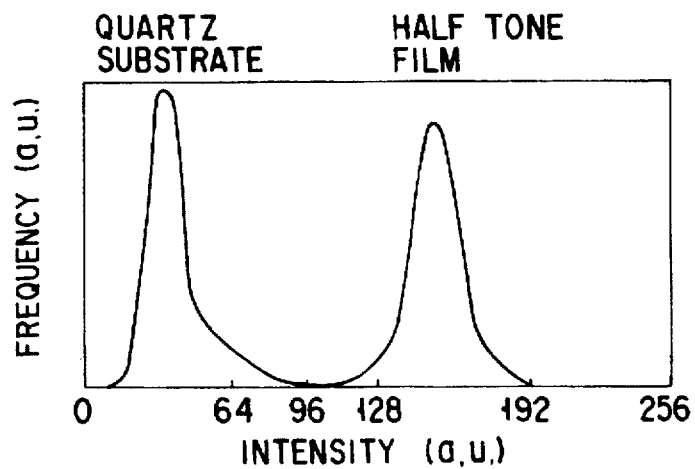
FIG. 3 is a graph showing the relationship between the secondary electron intensity for the halftone mask and its frequency (number of pixels) after application of a median filter.

FIG. 3 shows the histogram of this data after application of a median filter. The peak for the $SiN_x$ film and that for the quartz substrate can be separated by the median filter, so that the $SiN_x$ film can be discriminated from the quartz substrate on the basis of the intensity.

Figures 4, 5, 6:
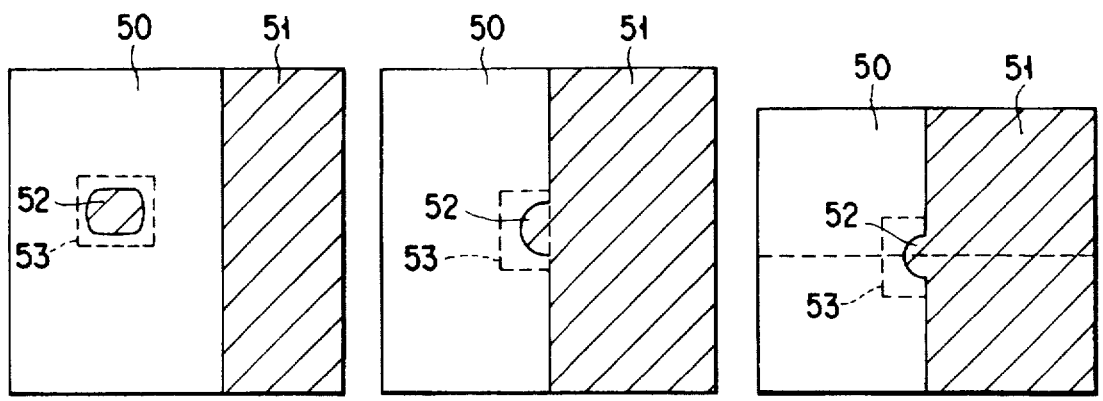
FIG. 4 is a view for explaining a method of setting a region by an external input portion when an isolated bump defect is to be repaired.
FIG. 5 is a view for explaining a method of setting a region by the external input portion when a bump defect generated at a pattern edge portion is to be repaired.
FIG. 6 is a view showing a bump defect generated at the halftone film edge of a halftone mask so as to explain a mask defect repair method according to the second and third embodiments of the present invention.

This data is displayed on the display 31, and a region including the defect is set. As shown in FIG. 4, for an isolated bump defect 52 consisting of an $SiN_x$ film 51 generated on a quartz substrate 50, a defect region (set region) 53 on the display is defined by enclosing the bump defect 52, as indicated by a dotted line. When a threshold value of "96" is set for the secondary particle intensity obtained after application of the median filter, the $SiN_x$ film portion and the quartz substrate portion are binarized and can be discriminated from each other, as is apparent from FIG. 3.

The $SiN_x$ film region of the bump defect 52 can be recognized by binarization. Therefore, this $SiN_x$ film region is set as a beam irradiation region and etched by gas assisted etching. With this processing, only the defect region consisting of the $SiN_x$ film can be removed.

For the bump defect 52 generated at the edge portion, as shown in FIG. 5, the region 53 including the defect is set along the edge on the display. Like the isolated defect above, the $SiN_x$ film region as the defect region 52 can be recognized by binarization. The region 52 is set as a beam irradiation region, and gas assisted etching is performed. With this processing, only the defect portion consisting of the $SiN_x$ film can be removed.

In this example, median processing is used as smoothing processing. However, other methods can be used because the manner of degradation in edge or appearance of fine gradation changes depending on the noise amount and contrast difference in original data, or the necessary number of times of smoothing operations. For example, a local averaging filter which uses an average intensity value of several peripheral pixels of a given pixel as the intensity of the given pixel, a local weights averaging filter which uses the average weighted intensity value of several peripheral pixels of a given pixel as the intensity of the given pixel, a variable weights averaging method which changes the weight for a weighted average in correspondence with individual patterns, or a sub-local areas dividing method which divides a region consisting of several peripheral pixels of a given pixel into a plurality of local regions, and uses a sub-local region apparently having the most uniform intensity to perform smoothing can be used.

In addition, a localized pixel selection method in which, in a region consisting of several peripheral pixels of a given pixel, a few pixels having intensities close to the intensity of the given pixel are selected, and the average intensity is used as the intensity of the given pixel can also be used. Furthermore, though the image processing time is prolonged, smoothing processing by a slope facet model smoothing method, a small amplifier element removal method, or a relaxation method, or smoothing processing by processing in a frequency region can also be used, as needed.

In this example, a fixed threshold value is employed for the threshold value determination method. However, a threshold value can also be determined by an automatic threshold value determination method which automatically determines a threshold value, i.e., such that an inter-class variance obtained by dividing the histogram into two classes is maximized, or an ambiguity for determining which class has a certain degree is minimized in the worst distribution can also be used.

When the resultant signal intensity changes depending on the position in one image because of a small system variation, binarization can be performed by dynamic thresholding.

In this embodiment, the thin film formed on the mask substrate as a sample consists of $SiN_x$. However, the thin film formed on the mask substrate is not limited to $SiN_x$. MoSi, MoSiO, MoSiON, WSiO, C, Cr, CrO, or Si can also be similarly applied. When the sample consists of a plurality of substances, an appropriate threshold value can be set to make multi-valued data.

The defect repair described in this embodiment is not limited to the bump defect repair but can also be used for a divot defect repair. When the method of this embodiment is used, the film formed on the substrate can be discriminated from the exposed substrate portion, and a divot defect portion can be recognized. With a system for supplying a source gas for depositing a desired film to the sample surface, a thin film can be deposited by supplying the source gas to the sample surface and irradiating an FIB at the divot defect portion of the film formed on the substrate.

For the opaque film portion of a Cr mask or an alternated type phase shifting mask, pyrene or styrene gas can be used as a source gas to repair a divot defect portion. A halftone mask can also be repaired by depositing an opaque film, though the repairable size is limited. For a halftone mask with a poor S/N ratio, the method of this embodiment is particularly effectively applied to recognize a divot defect portion.

(Second Embodiment)

The second embodiment of the present invention will be described below. In this embodiment, a substance formed on a mask is determined by image processing. Thereafter, as for the boundary portion of a particle beam irradiation region, the boundary of the beam irradiation region is newly set on the basis of a predetermined rule in terms of secondary particle intensity near the boundary.

FIG. 6 shows a bump defect 52 generated on a mask with an $SiN_x$ film 51 formed on a quartz substrate 50. After smoothing processing is performed, as in the first embodiment, binarization is performed while setting a threshold value. With this processing, an unnecessary material portion in the region set by an external input portion is recognized. This region is temporarily set as an FIB irradiation region.

Figures 7, 8:
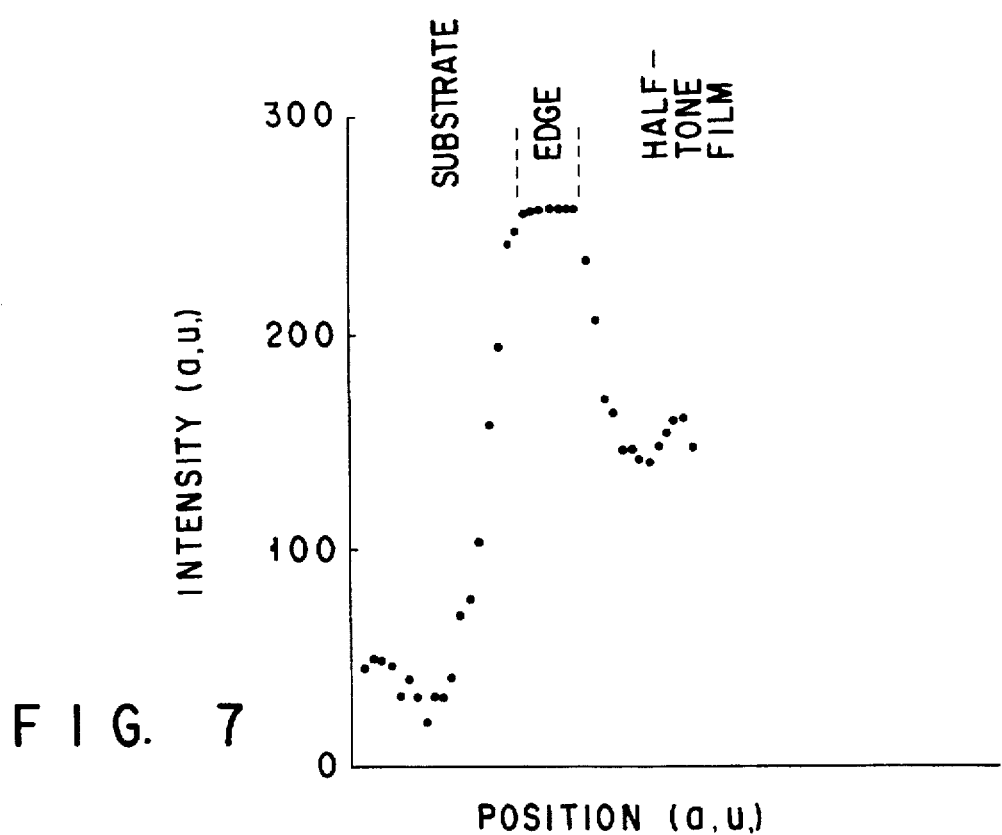
FIG. 7 is a graph showing the relationship between a position and an intensity as a result of image processing with a median filter of a secondary electron intensity obtained near the film edge when an ion beam is scanned along a dotted line in FIG. 6.
FIG. 8 is a graph showing the relationship between a position and a secondary electron intensity obtained near the film edge when an ion beam is scanned along the dotted line in FIG. 6.

FIG. 7 is a graph showing the result of median processing of a secondary electron intensity obtained near the edge of the bump defect of the $SiN_x$ film when an ion beam is scanned along a dotted line in FIG. 6 (binarization by setting a threshold value is not performed). A portion which exhibits the highest intensity upon image processing with a median filter corresponds to the edge portion of the $SiN_x$ film. The left side corresponds to the quartz region, and the right side corresponds to the $SiN_x$ film. As is apparent from FIG. 7, the edge has a width. Depending on which portion is regarded as a boundary for beam irradiation, the quartz substrate outside the unnecessary portion may be etched, or the film may be left. Particularly, in gas assisted etching using a gas, a portion outside the actual beam irradiation position may be etched depending on the selected beam condition.

For these reasons, an appropriate portion of the leading edge must be determined as a boundary for beam irradiation. This boundary depends on the type of the mask, the side wall angle of the edge portion of the opaque film, the beam diameter, and the like, and is determined by a preliminary experiment. For example, when a halftone film consisting of $SiN_x$ is to be removed by gas assisted etching using $XeF_2$, the boundary for beam irradiation can be optimally set at a position on the quarts substrate, at which the secondary particle intensity is 200.

A beam is irradiated under the concomitant of $XeF_2$ on only the halftone film side of the boundary determined in the above manner, so that the bump defect is removed by gas assisted etching. Since the beam is not irradiated outside the defect region, only the defect portion can be removed without excessively etching the quartz substrate.

In this embodiment, the boundary is determined by setting a threshold value for the secondary particle intensity. However, the edge determination method is not limited to this method. For example, a method in which a position at which the secondary particle intensity exhibits a predetermined ratio to the maximum value of the intensity of secondary particles emitted from the edge portion is defined as the boundary of a beam irradiation region, a method in which a position at which the secondary particle intensity reaches a predetermined intensity while the average secondary particle intensity for the substrate or the mask material formed on the substrate is used as a reference is defined as the boundary of a beam irradiation region, a method in which a position separated by a predetermined distance from a position at which the maximum value of the intensity of secondary particles emitted from the edge portion is defined as the boundary of a beam irradiation region, or the like can be used.

In this embodiment, determination of the material of the defect portion and determination of the boundary for beam irradiation are made in combination with image processing with a median filter. However, as described in the first embodiment, not only median processing but averaging processing, a local weights averaging filter, a variable weights averaging filter, a sub-local areas dividing method, a localized pixel selection method, or the like can also be used as smoothing processing. Particularly, with this embodiment, an edge degradation caused by smoothing processing can be corrected.

The method described in this embodiment is not limited to the bump defect repair and can also be used for the divot defect repair. With this embodiment, the film formed on the substrate can be discriminated from the exposed substrate portion, as in the first embodiment, so that the divot defect portion can be recognized.

When a divot defect is to be repaired, an FIB is irradiated on a gas to cause cracking and reaction of the gas as in etching. Depending on the beam irradiation condition at this time, a thin film may be deposited outside the actual beam irradiation position. When a halftone film is repaired with an opaque film, and the repair area increases, the opaque portion is increased. For this reason, the linewidth of the pattern transferred on a wafer becomes small, and the beam irradiation region must be corrected. The same method as described above is used for the edge of a pattern near the boundary portion of a temporary FIB irradiation region, and the boundary of the FIB irradiation region of the divot defect region is set again. With this processing, a thin film can be deposited at a desired position.

(Third Embodiment)

The third embodiment of the present invention will be described below. In this embodiment, noise included in the secondary particle intensity is removed by smoothing processing. Thereafter, an edge is recognized, and the boundary of a beam irradiation region is set on the basis of a predetermined rule for determining a change in secondary particle intensity near the edge.

This embodiment will also be described with reference to FIG. 6. For a mask with a bump defect 52 which is checked by an inspection device in advance, an FIB is irradiated on the mask including the bump defect, and a two-dimensional secondary particle intensity is fetched by a computer. The secondary particle intensity includes noise. When an ion beam is scanned along a straight line in FIG. 6, the secondary electron intensity signal obtained near the edge of the bump defect of the $SiN_x$ film has a low S/N ratio, as shown in FIG. 8. However, this noise is removed by image processing with a median filter, as shown in FIG. 7, so that the edge can be properly recognized.

In a mask with an $SiN_x$ film formed on a quartz substrate, the probability of secondary particle emission at the edge portion is higher than that at the central flat portion of the $SiN_x$ film or that for the quartz substrate. Therefore, the secondary particle intensity at the edge portion becomes high, so the edge portion can be easily recognized. For example, the central flat film portion of the $SiN_x$ film or the quartz substrate portion is designated by an external input portion, so that a portion consisting of a predetermined number or more pixels which exhibit a secondary particle intensity higher than the intensity of the designated portion by a predetermined value can be recognized as an edge.

As described above in the second embodiment, the edge has a width. For this reason, depending on which portion is regarded as the boundary of a beam irradiation region, the quartz substrate outside the unnecessary portion may be etched, or the film may be left. Particularly, in gas assisted etching using a gas, a portion outside an actual beam irradiation position is etched depending on the selected beam condition.

For these reasons, an appropriate portion of the leading edge must be determined as a boundary for beam irradiation. This boundary depends on the type of the mask, the side wall angle, the beam diameter, and the like, and is determined by a preliminary experiment. For example, when a halftone film consisting of $SiN_x$ is to be removed by gas assisted etching using $XeF_2$, the boundary for beam irradiation is optimally set at a position on the quartz substrate side, at which the secondary particle intensity is 200. Consequently, the position at which the secondary particle intensity is 200 can be regarded as the boundary for beam irradiation.

One side of the recognized edge is designated for etching by an external memory, and a beam is irradiated under the concomitant of the $XeF_2$ on only the halftone film side of the boundary determined in the above manner, thereby removing the bump defect by gas assisted etching. Since the beam is not irradiated outside the defect region, only the defect portion can be removed without excessively etching the quartz substrate.

In this embodiment, the boundary is determined by setting a threshold value for the secondary particle intensity. However, the edge determination method is not limited to this method, and various methods described in the second embodiment can be employed. The method described in this embodiment is not limited to a bump defect repair and can also be used for a divot defect repair. As described in the second embodiment, when a divot defect is to be repaired, the beam irradiation region must be corrected. The same method as described above is used for an edge in a region set by the external input portion, and the boundary of the FIB irradiation region of the divot defect region is set. With this processing, a thin film can be deposited at a desired position.

(Fourth Embodiment)

The fourth embodiment of the present invention will be described below. In this embodiment, a dose in imaging will be described.

Figure 9:
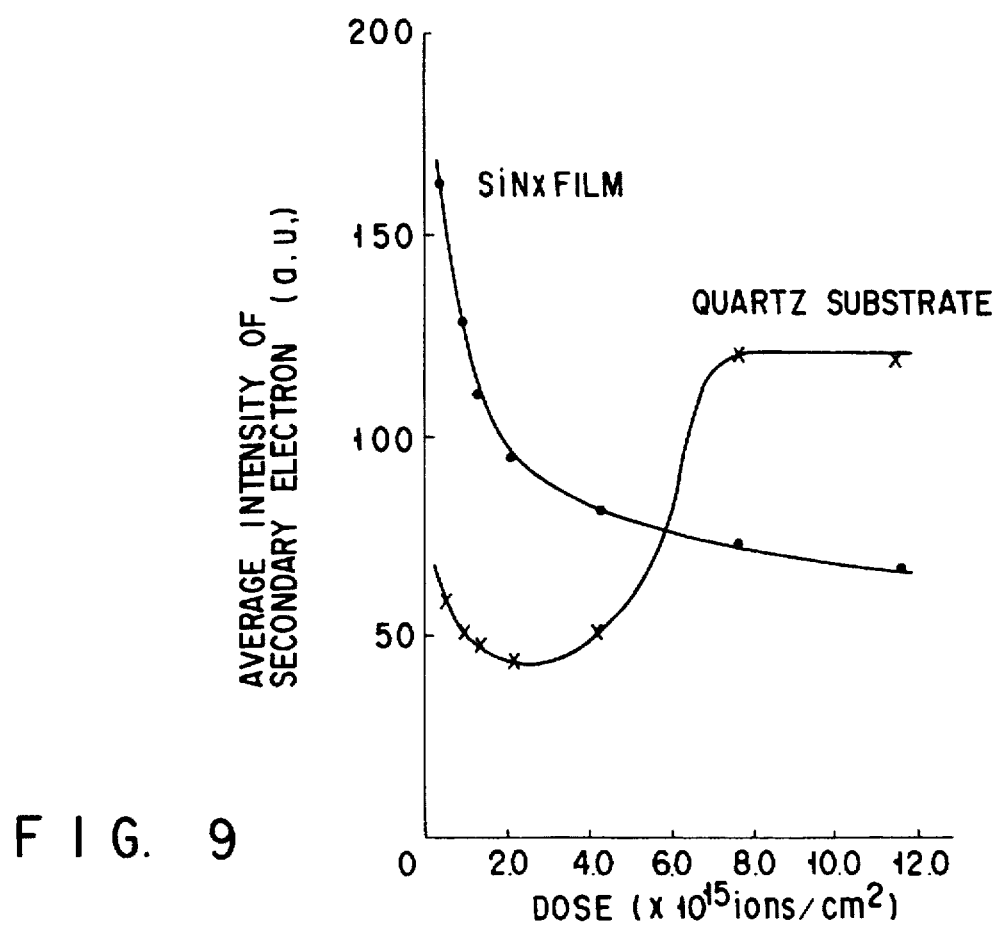
FIG. 9 is a graph showing the dependencies of the average secondary electron intensities for a quartz substrate and an SiN$_x$ film on a dose so as to explain the fourth embodiment of the present invention.

FIG. 9 is a graph showing changes in average secondary electron intensities for a quartz substrate and an $SiN_x$ film with respect to a dose, which are obtained in imaging. For both the quartz substrate and the $SiN_x$ film, the intensities decrease as the dose increases first. However, the intensity for the quartz substrate starts to increase from a certain point, and the intensities for the $SiN_x$ film and the quartz substrate are reversed at a certain point. In this example, both the curves intersect at a dose of $5.8 \times 10^{15}$ ions/cm². When a substance is to be discriminated by smoothing processing as described in the first embodiment, two substances must have an intensity difference therebetween. Therefore, to discriminate one a substance from another, imaging must be performed at a dose smaller or larger than $6 \times 10^{15}$ ions/cm² corresponding to the intersection of the curves.

However, as shown in FIGS. 10 and 11, when the dose increases, both the quartz substrate and the $SiN_x$ film are damaged by ion beam irradiation. This decreases the transmissivity, so the mask cannot be used as an exposure mask. The influence of the decrease in transmissivity on the transfer pattern changes depending on the type of mask. It is generally considered that a quartz substrate must have a transmissivity of at least about 90%, and an $SiN_x$ film must have a transmissivity of at least about 5.5%. Therefore, to suppress a decrease in transmissivity caused by ion beam irradiation, the dose must be about $5 \times 10^{15}$ ions/cm² or less.

As described above, when the dose in imaging is $6 \times 10^{15}$ ions/cm² or less at which the intensity of secondary particles from the mask substrate equals that for the film formed on the mask substrate, the transmissivity of the mask is prevented from being decreased. In addition, an image in which a substance can be discriminated with smoothing processing can be obtained.

This phenomenon is observed not only when secondary electrons are monitored but also when secondary ions are monitored. FIG. 12 is a graph showing changes in average secondary ion intensities for a quartz substrate and an $SiN_x$ film with respect to a dose. As for the secondary ion intensity, the intensity for the quartz substrate increases as the dose increases. The intensity for the halftone film remains almost stable and then decreases as the dose increases. The two curves intersect at a dose of $1.2 \times 10^{15}$ ions/cm². In this case as well, a decrease in transmissivity is permitted when the dose is $5 \times 10^{15}$ ions/cm² or less. Therefore, when the dose in imaging is $1 \times 10^{15}$ ions/cm² or less, the transmissivity of the mask is prevented from being decreased. In addition, an image in which a substance can be discriminated with smoothing processing can be obtained.

Figure 13:
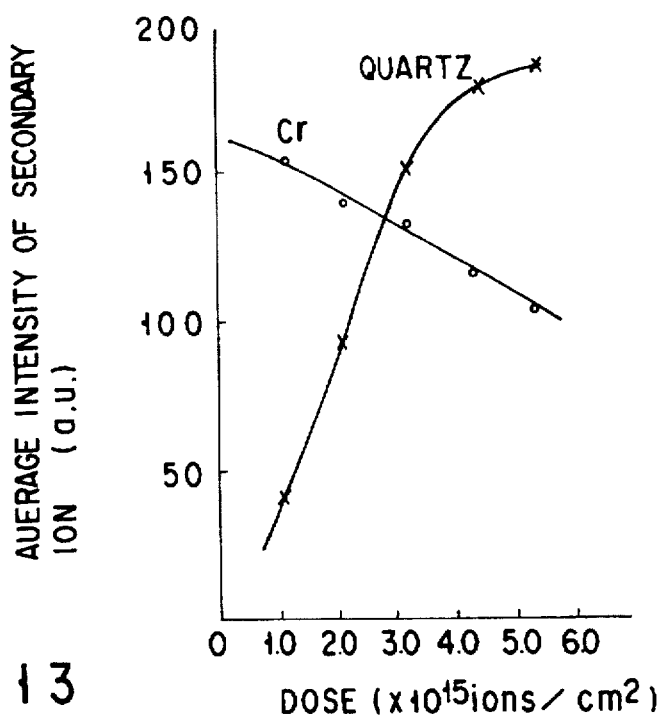
FIG. 13 is a graph showing the dependencies of the average secondary ion intensities for the quartz substrate and a Cr film on the dose.

This phenomenon is also observed for the secondary ion image of a Cr mask. As is apparent from FIG. 13, as the dose increases, the intensity for quartz increases while that for Cr decreases. The two intensities equal each other at a dose of $2.8 \times 10^{15}$ ions/cm². To prevent the transmissivity from being decreased and discriminate a substance with smoothing processing, the dose for imaging must be $3 \times 10^{15}$ ions/cm² or less, at which the intensities for quartz and Cr equal each other.

The above-described change in secondary electron intensity or secondary ion intensity with respect to a dose is considerably caused by implantation of the irradiated ion beam in the sample. For this reason, regardless of the material such as quartz, $SiN_x$, or Cr, the secondary electron intensity or secondary ion intensity changes in accordance with a change in dose. Therefore, when, in accordance with a combination of a mask substrate and a thin film formed on the mask substrate is selected, imaging is performed at a dose smaller than that at which the intensities for the mask substrate and the thin film equal each other, the transmissivity of the mask is prevented from being decreased. In addition, an image in which a substance can be discriminated with smoothing processing can be obtained.

(Fifth Embodiment)

The fifth embodiment of the present invention will be described below. In this embodiment, a method of detecting an end point when a defect has a nonuniform film thickness will be described.

Figure 14:
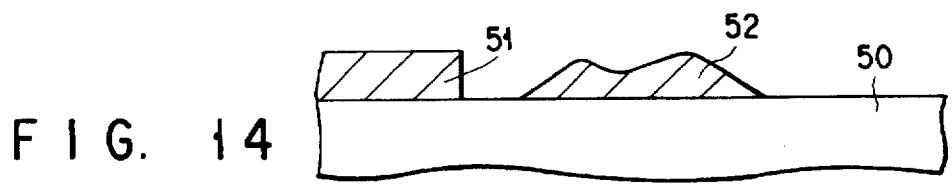
FIG. 14 is a sectional view showing an example of a bump defect with a nonuniform film thickness so as to explain the fifth and sixth embodiments of the present invention.

For a bump defect 52 having a nonuniform film thickness, as shown in FIG. 14, image processing is performed for a secondary particle intensity obtained by beam irradiation, an etching region is set, and the beam irradiation position is determined by an adaptive beam blanking method. Etching of this region is performed, thereafter. During etching, a small region, e.g., a total of 9 pixels consisting of 3×3 pixels are defined as one unit, and secondary particle intensities obtained by irradiating an ion beam on these small regions are integrated a predetermined number of times of scanning operations, thereby obtaining the secondary particle intensity of this region.

With the intensity obtained for one pixel by one scanning operation, an end point can hardly be detected because of large noise. However, when intensities obtained by a plurality of number of times of scanning with respect to a unit of several pixels are integrated, the noise can be reduced, so that a signal with minimum noise and usable for end point detection can be obtained. The number of times of integration operations changes depending on the beam irradiation time per scanning operation and the performance of the detector.

A secondary particle intensity obtained at the initial stage of etching largely varies because neither particle beam implantation in the thin film nor etching reach a steady state. For an unnecessary substance (an opaque film material or a halftone film material) constituting the defect portion, a dose at which a steady state is set is obtained, and an integrated intensity obtained by scanning a beam a predetermined number of times at this dose is stored in a memory in advance. When etching progresses, and removal of the unnecessary substance comes to an end point, the resultant secondary particle intensity changes. Though depending on the combination of the substrate and the unnecessary substance, secondary particle intensities for, e.g., a quartz substrate and an $SiN_x$ film start to increase. The etching end point of the small region is determined when the integrated intensity obtained during etching reaches a predetermined ratio to the initial integrated intensity stored in the memory.

When sputter etching is performed for the combination of the quartz substrate and the $SiN_x$ film, the end point is detected with an intensity 1.2 times the initial intensity. For each small region, beam irradiation on the small region is stopped when the secondary particle intensity becomes 1.2 times the initial intensity, and the beam is irradiated on only a portion where the unnecessary substance remains. With this processing, even when the film thickness of the defect portion is nonuniform, the defect can be removed without etching the substrate, resulting in a flat surface.

$SiN_x$ formed on quartz has been described above. However, this method is not limited to $SiN_x$ formed on quartz and can also be performed for another thin film.

(Sixth Embodiment)

The sixth embodiment of the present invention will be described below. In this embodiment, another method of detecting an end point when a defect has a nonuniform film thickness will be described.

For a bump defect 52 having a nonuniform film thickness, as shown in FIG. 14, image processing is performed for a secondary particle intensity obtained by beam irradiation, an etching region is set, and the beam irradiation position is determined by an adaptive beam blanking method. Etching of this region is performed, thereafter. The intensity of secondary particles emitted from each pixel during etching is fetched by a computer and subjected to smoothing processing using a local averaging filter, a median filter, or the like. The obtained value is fetched by the computer again as the intensity for the pixel. The values obtained in this manner are integrated a predetermined number of times of scanning operations. The sum of the integrated intensities with respect to a small region, e.g., a total of 9 pixels consisting of 3×3 pixels is the secondary particle intensity for that region.

With the intensity obtained for one pixel by one scanning operation, an end point can hardly be detected because of large noise. However, when smoothing processing is performed using information of the secondary particle intensity for peripheral pixels, and intensities obtained by a plurality of number of times of scanning operations are integrated, the noise can be reduced, and a signal with minimum noise and usable for end point detection can be obtained. The number of times of integration changes depending on the beam irradiation time per scanning operation and the performance of the detector.

A secondary particle intensity obtained at the initial stage of etching largely varies because neither particle beam implantation in the thin film nor etching reach a steady state. Therefore, for an unnecessary substance (an opaque film or a halftone film), a dose at which a steady state is set is obtained, and an intensity obtained by scanning a beam a predetermined number of times and processed as above described at this dose is stored in a memory in advance. When etching progresses, and removal of the unnecessary substance comes to an end point, the resultant secondary particle intensity changes. Etching end point is determined when the secondary particle intensity reaches a predetermined ratio to the initial intensity stored in the memory.

In this embodiment, after image processing is performed for the respective pixels, intensities obtained by a plurality of number of times of scanning operations are integrated. However, after intensities obtained by a plurality of number of times of scanning operations are integrated, image processing may be performed.

When sputter etching is performed for the combination of the quartz substrate and the $SiN_x$ film, the end point is detected with an intensity 1.2 times the initial intensity. For each small region, beam irradiation on the small region is stopped when the secondary particle intensity becomes 1.2 times the initial intensity, and the beam is irradiated on only a portion where the unnecessary substance remains. With this processing, even when the film thickness of the defect portion is nonuniform, the defect can be removed without etching the substrate, resulting in a flat surface.

$SiN_x$ formed on quartz has been described above. However, this method is not limited to $SiN_x$ formed on quartz and can also be performed for another thin film.

As described above, according to the first to sixth embodiments, imaging of a region including a bump defect generated on a mask can be performed while suppressing damage caused by FIB irradiation. Since the substance formed on the mask can be determined on the basis of the obtained image, and a beam irradiation region for defect removal can be properly set, the defect can be removed without etching a portion outside the defect region. In addition, according to the present invention, for a defect having a nonuniform film thickness, the S/N ratio of secondary particles obtained during etching can be improved, so that the defect can be accurately removed, resulting in a flat surface.

(Seventh Embodiment)

In this embodiment, a defect recognition method in which the two-dimensional intensity distribution of secondary particles within a range wider than a desired processing region is fetched by a computer, and particularly, a method of employing, as the range wider than the desired processing region, a region defined by adding the application range of a smoothing filter (the radius of a filter, which will be described later) to the desired processing region will be described.

A smoothing filter is used to determine the value of a certain pixel by using the information of peripheral pixels. Assume that a region to which the filter is applied equals the region where the two-dimensional intensity distribution of secondary particles is obtained. In this case, since the necessary information of peripheral pixels is absent at the end of the region to which the filter is applied, the secondary particle intensity of the pixel after application of the filter differs from that at the central portion of the region. For this reason, when a particle beam irradiation region is to be determined on the basis of the secondary particle intensity after application of the filter, the region may be erroneously recognized.

Figure 15:
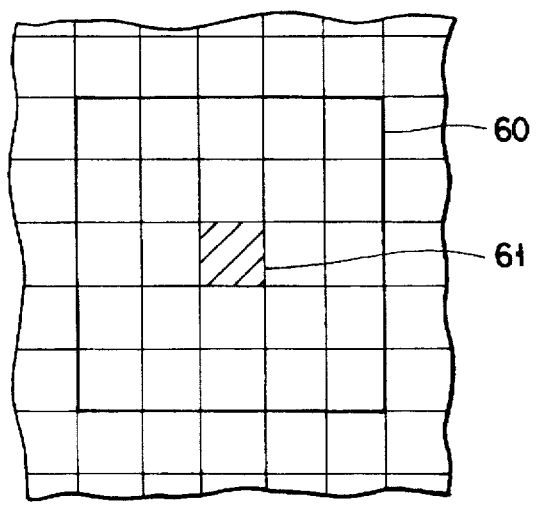
FIG. 15 is a view showing the application range of an image processing filter for a pixel at the center of an image so as to explain the seventh embodiment.
Figure 16:
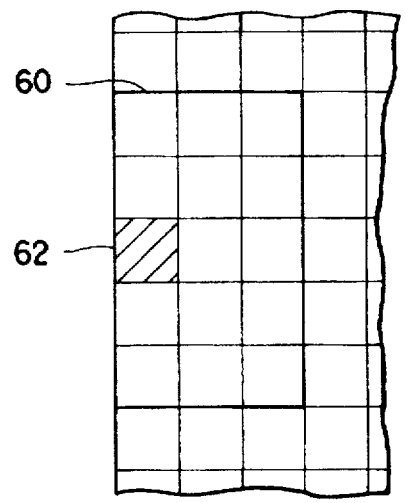
FIG. 16 is a view showing the application range of the image processing filter for a pixel at the end of the image so as to explain the seventh embodiment.

The case that the region 60 to which a median filter is applied consists of 5×5 pixels, as shown in FIG. 15, will be described (when viewed from the central pixel, two pixels are included on one side along the vertical and lateral directions, so that this region is called radius (r) 2; this definition of a radius will be applied below). As for a central pixel 61 shown in FIG. 15, the median of the secondary electron intensities for 25 pixels including 24 pixels around the pixel 61 is defined as the secondary electron intensity for the central pixel 61. As for a pixel at the end of the image, only 15 pixels have the pieces of information of secondary electron intensities, as shown in FIG. 16, and the median is determined using these pieces of information. For this reason, the secondary electron intensity for a pixel 62 at the end of the image largely differs from that for the pixel at the central portion of the image.

In fact, after the secondary electron intensity for a halftone film portion was obtained, a filter was applied, and a change in standard deviation for 300 points of one line along the vertical direction with respect to the number of pixels from the end of the image was measured. This result is shown in FIG. 17. The standard deviation decreases as the pixel position is separated from the end. The standard deviation takes a constant value near the fourth pixel from the end of an image for radius 3 (7×7 pixels) or near the sixth pixel from the end of an image for radius 5 (11 ×11 pixels).

For this reason, the secondary electron intensity values for pixels which are separated from the end of an image by a distance smaller than the radius of the filter largely vary, so that the region is erroneously recognized at a high probability. In addition, when the distribution obtained first has a change in secondary electron intensity value depending on the number of pixels used for filter application, the value at the end of an image differs from that at the central portion of the image after application of the filter.

At a corner of an image, the information amount used for filter application further decreases. For this reason, the above-described variations in secondary electron intensities become large, so that the probability of erroneous recognition becomes higher. Therefore, it is expected that a defect is excessively etched, or a bump defect cannot be completely removed and left.

This problem can be solved by forming an image having a size larger than the desired processing region and, more particularly, larger than the application range of the smoothing filter such that necessary information can be obtained even at the end of the processing region. In fact, as is apparent from FIG. 17, the variation is almost eliminated from the fourth pixel from the end of the box for filter radius 3, or from the sixth pixel from the end of the box for radius 5. The variation can be minimized by forming an image having a size larger by the filter application range, and erroneous recognition can be prevented.

Actually, defects at 100 portions were repaired, and the presence/absence of defects was checked by a defect inspection apparatus. When the desired processing region equaled the imaging region, a total of five remaining defects and etched substrate portions were detected. However, when the imaging region was set to have a size larger by the filter application range, no defects were detected at the 100 portions by the inspection apparatus. Therefore, it is found that, when an image is formed to have a size larger by the filter application range, erroneous recognition at the end of the region set by an external input portion can be prevented, so that the particle beam irradiation region can be properly determined.

(Eighth Embodiment)

In this embodiment, a method of correcting a drift generated during image processing will be described. When a resultant image includes little noise and has a sufficient contrast, the application range of an image filter can be small. However, for an image with large noise or a low contrast, the application range of the image filter must be widened, or a complex image filter which requires a long time must be used for the purpose of obtaining a usable processing image, resulting in an increase in processing time. A beam or stage varies during long-time image processing. For this reason, after image processing, the position of an image is shifted from that at the time of imaging. When the processing time exceeds 10 minutes, the defect generation probability abruptly becomes high. Therefore, a drift generated during processing must be corrected. An example of the drift correction method will be described below.

FIG. 18 is a graph showing a secondary electron intensity at the edge portion of a defect consisting of a halftone film. Though the secondary electron intensity includes large noise, the secondary electron intensity at the edge portion of the defect is much higher than that at the central flat film portion. By appropriately setting the gain of a detector and luminance adjustment, the intensity at the edge portion can be displayed such that the intensities are continuously saturated for several pixels. On the basis of this display, a region for which intensities are continuously saturated for several pixels can be regarded as an edge.

Prior to repair, a secondary electron intensity image (image 1) for the region including the defect is acquired. Image processing is performed for image 1, and an image after processing (image 2) is obtained. On the other hand, the coordinates of pixels of image 1, for which intensities are continuously saturated, are selected. Upon completion of image processing, an FIB is irradiated again to acquire a secondary electron intensity image (image 3). For image 3 as well, the coordinates of pixels for which the intensities are continuously saturated are selected and compared with the coordinates obtained for image 1. If both the coordinates of the pixels for which the intensities are continuously saturated equal each other, processing is continued. If the coordinates are different, the shift is corrected.

An example of the method of selecting the coordinates of pixels for which the intensities are continuously saturated will be described below. First, a pixel for which the intensity is saturated is selected. If there is more than one pixel, for which the intensity is saturated among eight pixels and the selected pixel, the selected pixel is selected. If there is no pixel for which the intensity is not saturated, no pixel is selected.

When the luminance changes due to a plurality of number of times of imaging operations, the width of the high-luminance portion of the edge changes accordingly. For this reason, even at the same portion, the number of pixels for which the secondary electron intensities are continuously saturated changes. In this case, drift correction is enabled by adjusting the center of the pixels for which the intensities are saturated.

In the above embodiment, the secondary electron intensity has been described. However, even for secondary ions or neutral ions, the emission efficiency at an edge portion is higher than that at a flat film portion, and the intensity can be saturated by adjusting the detector, so that similar drift correction can be performed.

(Ninth Embodiment)

In this embodiment, a method in which the shape of a defect edge portion is estimated from the number of continuous pixels which exhibit secondary particle intensities of a predetermined value or more, thereby determining a beam irradiation region or a beam irradiation method will be described.

The secondary particle intensity increases as the angle of incident of an FIB becomes larger (gradually becomes parallel to the sample surface). The secondary particle intensity is maximized, and then abruptly decreases. The angle of incident of an FIB at an edge portion is larger than that at the flat portion of an opaque film. For this reason, the secondary particle emission effect is large, so that the secondary electron intensity is high.

Figure 19:
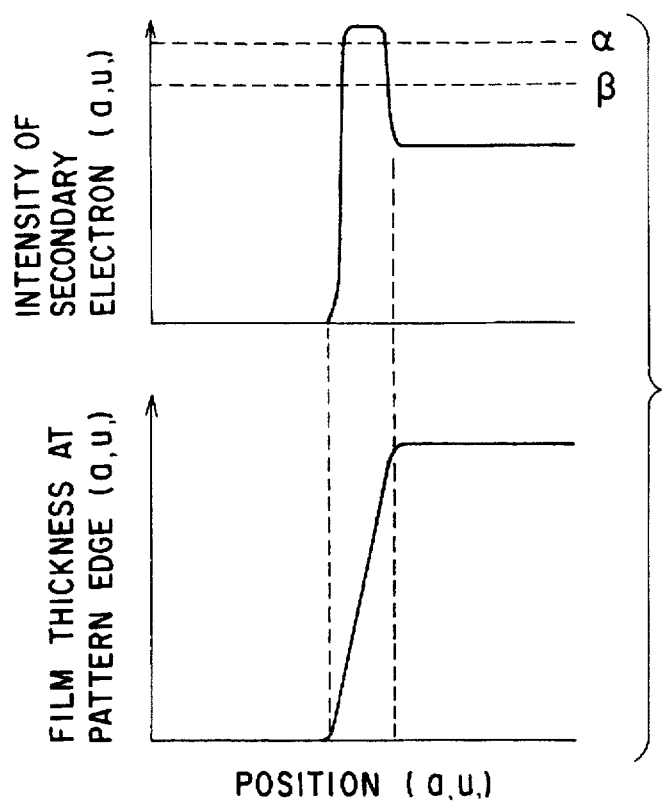
Figure 20:
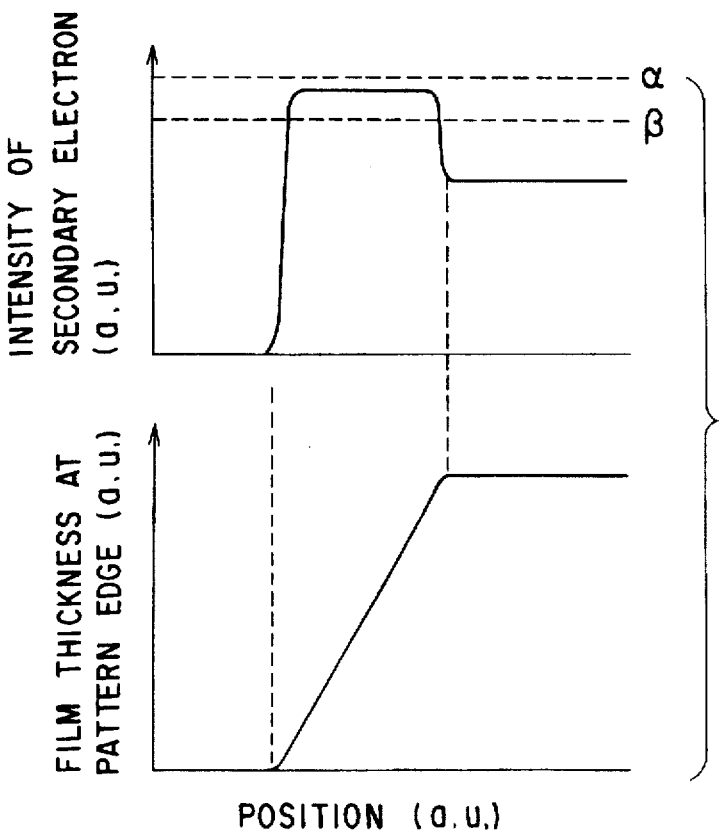

Using the difference between secondary particle emission probabilities, which is generated due to the shape, the side wall angle of the defect edge portion can be estimated from the secondary particle intensity. FIGS. 19 and 20 are graphs schematically showing the difference between secondary particle intensities, which is generated due to the difference between side wall angles. The secondary particle intensity observed when the side wall is close to horizontal (the side wall angle is close to 0°) is lower than that observed when the side wall is almost vertical (the side wall angle is almost 90°). However, the width exhibiting an intensity of a predetermined value or more increases (FIG. 20). The number of pixels for which the secondary particle intensities are continuously $\alpha$ or more will be considered. When the side wall angle is small (FIG. 20), no pixel has an intensity of $\alpha$ or more. When the side wall angle is large (FIG. 19), pixels having an intensity of $\alpha$ or more are present. The number of pixels for which the secondary particle intensities are continuously $\beta$ or more will be considered. When the side wall angle is small, the number of pixels having an intensity of $\beta$ or more is larger than that obtained when the side wall angle is large.

When the data of the number of continuous pixels which exhibit a secondary particle intensity of a predetermined value or more is recorded using a sample whose shape is known in advance, the edge shape of the defect can easily be estimated with reference to this data. The defect is removed on the basis of the estimated shape of the side wall. The beam irradiation region is determined considering the mask material, the diameter of the FIB, the type of etching (gas assisted etching or sputter etching), and the like. When the side wall angle is small, the dose or beam irradiation condition (e.g., a beam diameter, dwell time, a distance between dots, etc) is changed in accordance with a change in film thickness of the side wall portion.

For 100 actual bump defects generated in manufacturing a mask, the defects were repaired by estimating the edge shapes of the defects by the above method and checked by a mask inspection apparatus. No defects were detected, so that the effectiveness of this method was proved.

As described above, according to the seventh to ninth embodiments, a defect region can be properly recognized. Therefore, the substrate is not excessively etched, or a defect does not remain. In addition, even when the image processing time cannot be shortened, a drift generated during image processing can be corrected.

(10th Embodiment)

In the 10th embodiment, a halftone mask with a repeated line and space pattern (to be abbreviated as an L & S hereinafter) consisting of an $SiN_x$ film formed on a quartz substrate will be described. The pitch of the L & S on the mask is 2.75 μm, and the linewidth is 1.175 μm.

Figure 21:
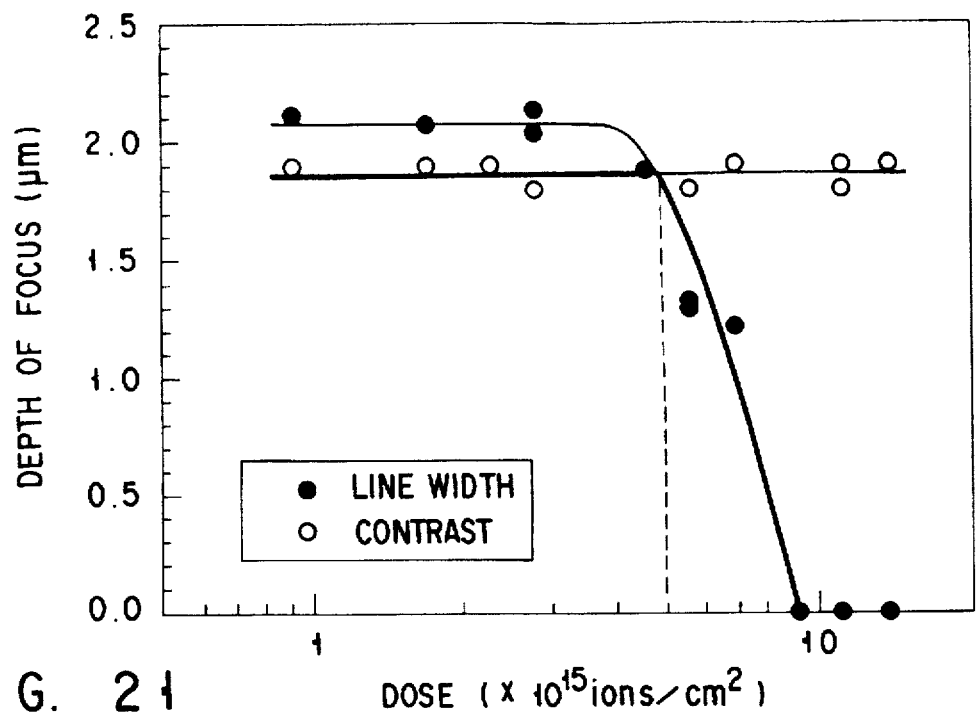
FIG. 21 is a graph showing a change in depth of focus (the latitude in linewidth variation is ±10% and the latitude in exposure amount is ±10%) with respect to an FIB dose for a 0.275-µm L & S so as to explain the 10th embodiment of the present invention.

FIG. 21 is a graph showing a change in depth of focus with respect to exposure light having a wave-length of 248 nm, which is observed when an FIB is irradiated on the 0.275-μm L & S portion. The latitude in exposure amount is 10% and the latitude in linewidth is ±10%. A black dot represents a depth of focus obtained on the basis of a linewidth variation by using the optical image intensity at the FIB irradiated portion. A white dot represents a depth of focus obtained on the basis of a contrast by using the optical image intensity at the FIB irradiated portion.

Figure 22:
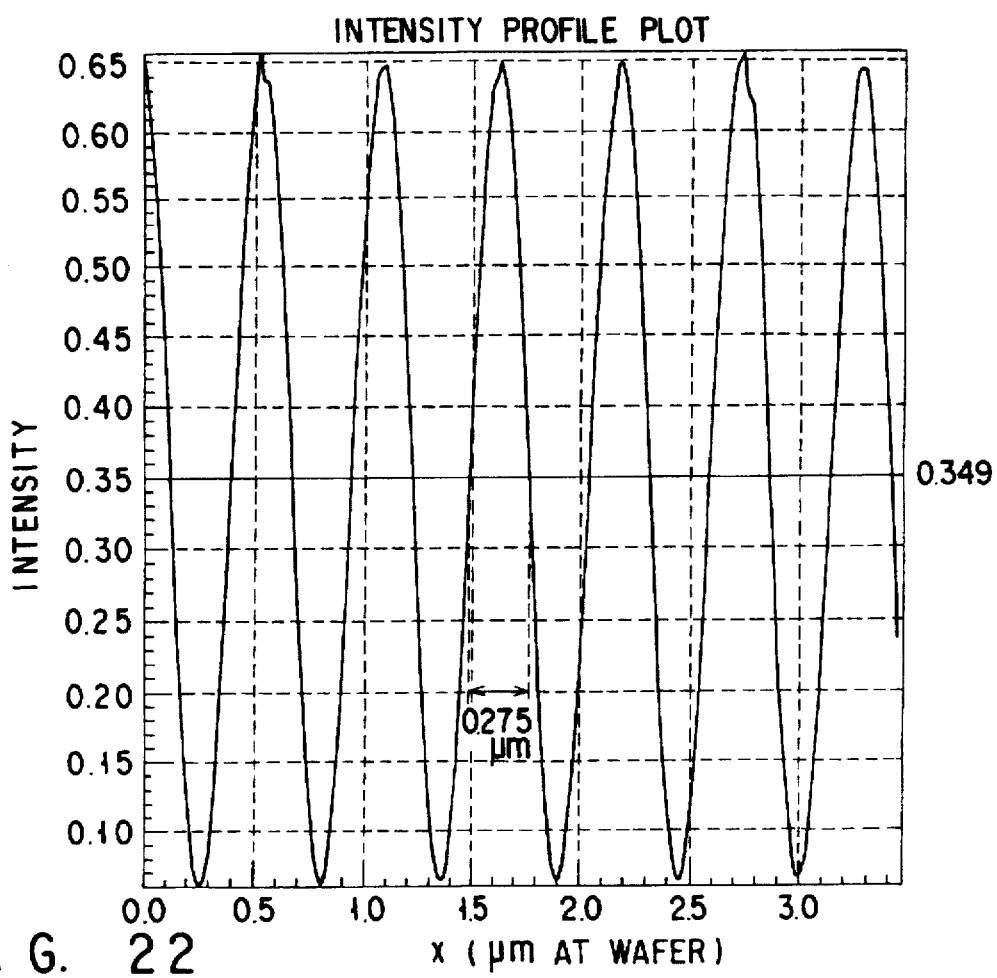
FIG. 22 is a graph showing the optical image intensity of an FIB non-irradiated portion for the 0.275-µm L & S.

The depth of focus can be obtained from the linewidth in the following manner. FIG. 22 shows an optical image intensity at an FIB non-irradiated portion in a just focus state. When a predetermined intensity of, e.g., 0.349 is set as a threshold value, resolution is performed at a linewidth of 0.275 μm on the basis of the intersections of the image intensity curve and the threshold value. A change in threshold value is equivalent to a change in exposure amount. Therefore, the threshold value of 0.349 for performing resolution at 0.275 μm as a design size at the FIB non-irradiated portion is set as an appropriate exposure amount.

Figure 23:
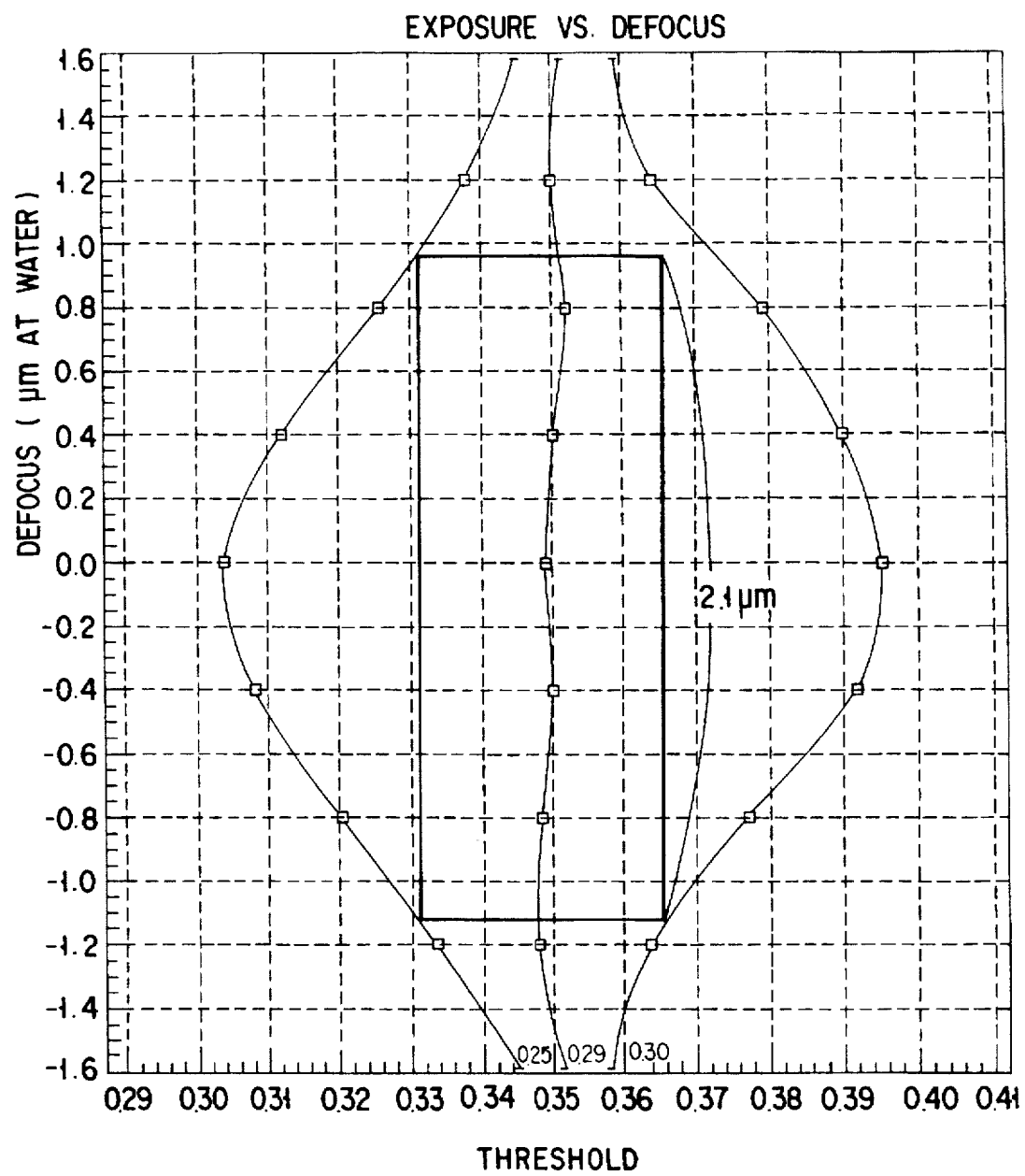
FIG. 23 is a graph showing the ED tree of the FIB non-irradiated portion for the 0.275-µm L & S.

Threshold values were set within a predetermined allowance from the appropriate exposure amount, and linewidth variations at the respective focus positions were obtained by the above method. FIG. 23 is an ED tree in which points where the linewidth is the design size and the variation is ±10% are plotted, while plotting the threshold values along the abscissa and defocus (focus positions) along the ordinate. When the latitude in exposure amount is 10% and the latitude in linewidth was ±10%, the depth of focus was obtained as 2.1 μm by opening a box (a rectangle in FIG. 23) such that the depth of focus was maximized with the latitude in exposure amount of 10%.

The depth of focus depends on not only the linewidth variation but also the resist characteristics. The white dots in FIG. 21 represent the depths of focus obtained on the basis of the contrast by using the optical image intensity at the FIB irradiated portion. The contrast is a parameter introduced to consider the resist characteristics and used to determine whether the difference between the light intensity at a position corresponding to the opening portion of the mask and that at a position corresponding to the dark portion of the mask is sufficient. The contrast is defined as (Imax−Imin)/(Imax+Imin) where Imax is the maximum value of the optical image intensity, and Imin is the minimum value of the optical image intensity.

First, for an FIB non-irradiated portion, a contrast having the same depth of focus as that within the variation allowance, which is obtained by a pattern transfer experiment using a resist to be evaluated, is obtained as a limit resolution contrast. In this case, the limit resolution contrast was obtained by transferring a 0.35-μm L & S. FIG. 24 is a graph showing the linewidth variation of the transferred pattern with respect to the focus position obtained for the 0.35-μm L & S with an optimum exposure amount. When the allowance of the linewidth is ±10%, the depth of focus can be 2.3 μm, as is apparent from FIG. 24.

FIG. 25 is a graph showing a change in contrast with respect to each focus position obtained from the optical image intensity distribution. The lowest contrast which satisfies the depth of focus of 2.3 μm is 40%, so that the limit resolution contrast is 40%. The depth of focus was evaluated using the limit resolution contrast for a 0.275-μL & S. For the 0.275-μm L & S, a change in contrast with respect to each focus position obtained from the optical image intensity distribution, as in FIG. 25, is obtained. Since resolution is performed at a contrast equal to or higher than the limit resolution contrast, the depth of focus determined by the contrast falls within the range of the contrast of 40% or more.

As is apparent from FIG. 21, the depth of focus obtained from the linewidth variation is constant until a dose of $4 \times 10^{15}$ ions/cm², and thereafter, decreases. The depth of focus obtained from the contrast is constant. The depth of focus obtained by the pattern transfer experiment corresponds to the smaller one of the depth of focus obtained from the linewidth variation and the depth of focus obtained from the contrast. This depth of is represented by a thick line in FIG. 21. The depth of focus does not change until a dose of $5 \times 10^{15}$ ions/cm². However, when the dose exceeds $5 \times 10^{15}$ ions/cm², the depth of focus abruptly decreases. When a defect is to be repaired by FIB irradiation, and the total FIB dose is set to be $5 \times 10^{15}$ ions/cm² or less, which corresponds to an intersection of the curve of depth of focus obtained from the linewidth variation and the curve of depth of focus obtained from the contrast, the mask is damaged. However, this damage adversely affecting the size of the resist pattern formed on the wafer can be prevented.

In FIG. 21, the depth of focus and the FIB dose allowance were obtained while setting the latitude in exposure amount at 10% and the latitude in linewidth variation at ±10%. However, the FIB dose allowance can change depending on the latitude in exposure amount and the latitude in linewidth variation. The FIB dose allowance is determined in accordance with several patterns depending on the latitude in exposure amount and the latitude in linewidth variation.

Figure 26:
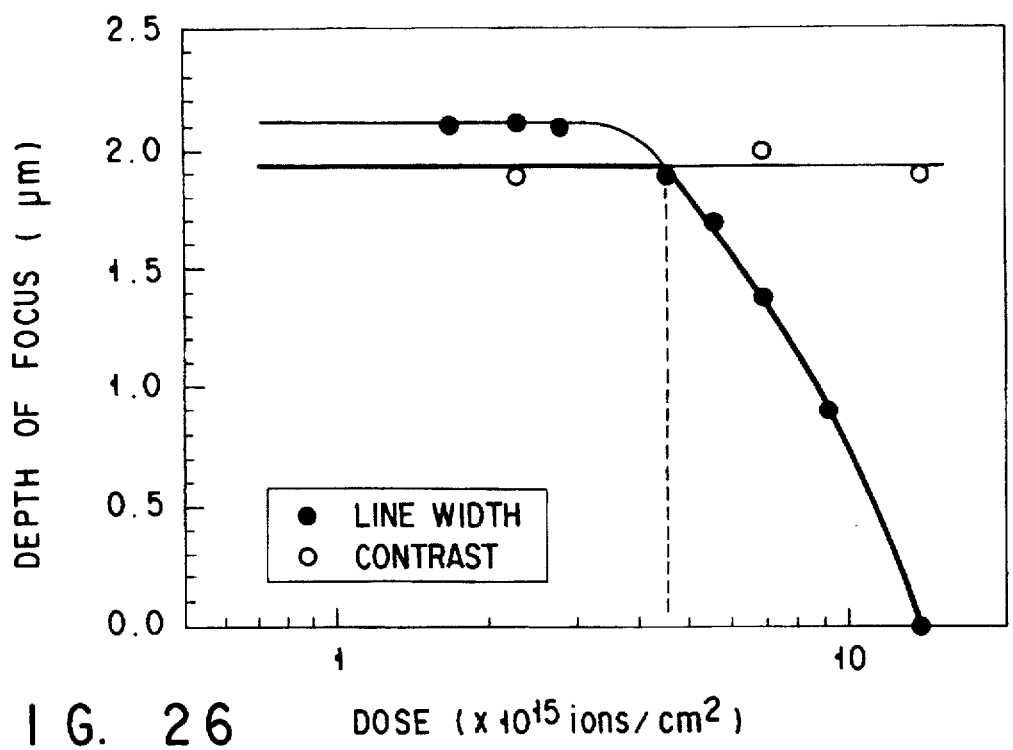
FIG. 26 is a graph showing a change in depth of focus (the latitude in exposure amount is 15% and the latitude in linewidth variation is ±15%) with respect to the FIB dose for the 0.275-µm L & S.
Figure 27:
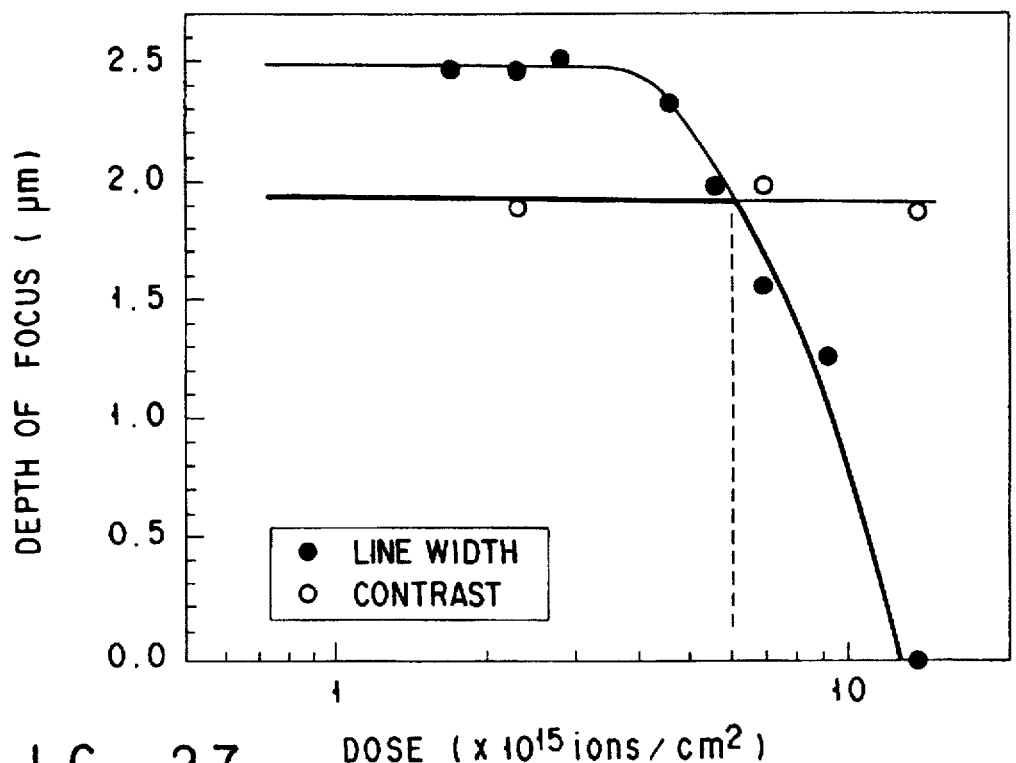
FIG. 27 is a graph showing a change in depth of focus (the latitude in exposure amount is 10% and the latitude in linewidth variation is ±15%) with respect to the FIB dose for the 0.275-µm L & S.
Figure 28:
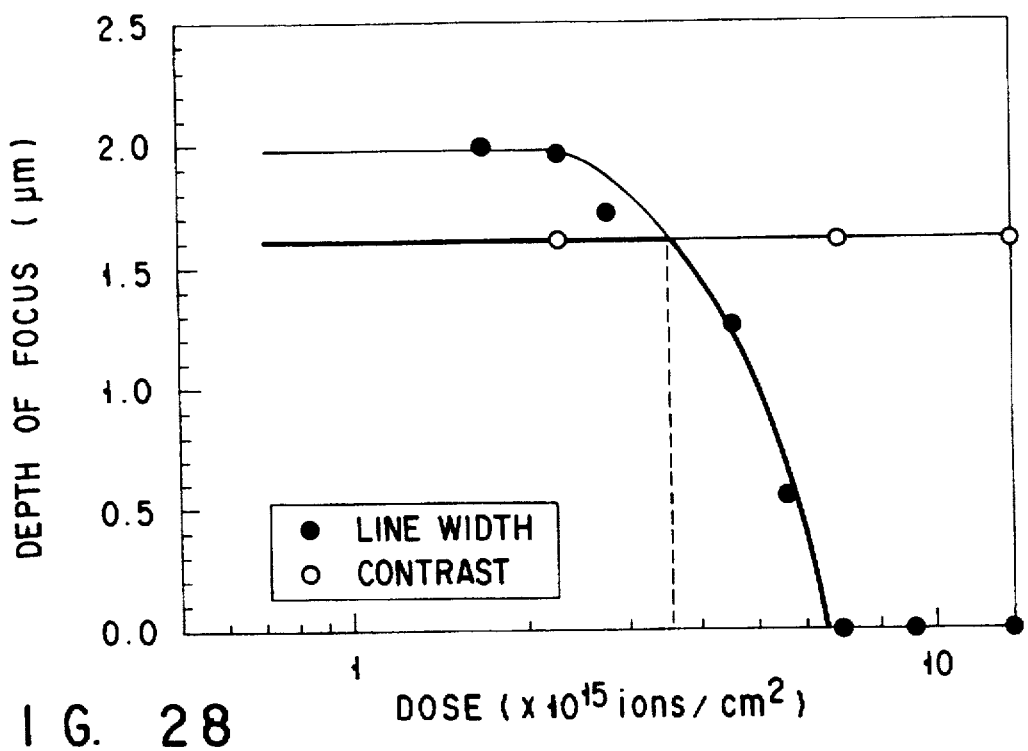
FIG. 28 is a graph showing a change in depth of focus (the latitude in exposure amount is 5% and the latitude in linewidth variation is ±5%) with respect to the FIB dose for the 0.275-µm L & S.
Figure 29:
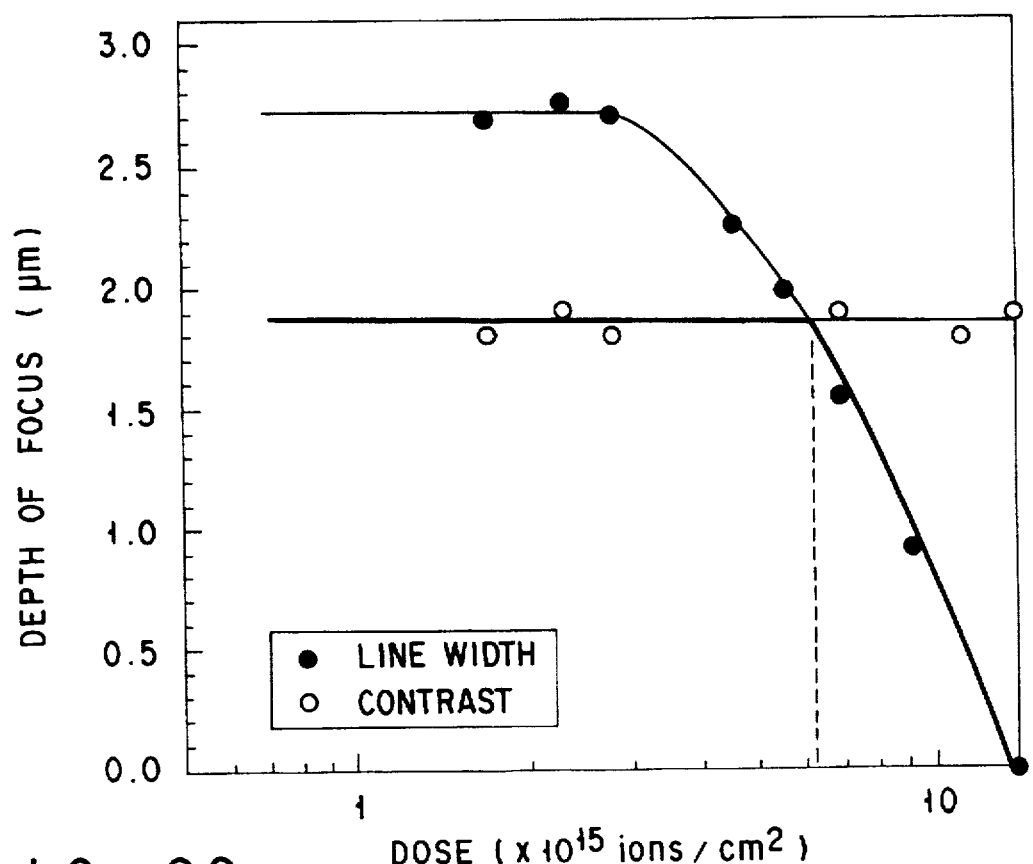
FIG. 29 is a graph showing a change in depth of focus (the latitude in exposure amount is 5% and the latitude in linewidth variation is ±10%) with respect to the FIB dose for the 0.275-µm L & S.

The first pattern is as follows. That is, the FIB dose allowance is smaller than a dose corresponding to the intersection of the curve of depth of focus obtained from the linewidth variation and the curve of depth of focus obtained from the contrast. This pattern is observed for the above-described 0.275-µm L & S when the latitude in exposure amount is 15%, and the latitude in linewidth is ±15% (FIG. 26 shows a change in depth of focus), when the latitude in exposure amount is 10%, and the latitude in linewidth is ±15% (FIG. 27 shows a change in depth of focus), when the latitude in exposure amount is 5%, and the latitude in linewidth is ±5% (FIG. 28 shows a change in depth of focus), and when the latitude in exposure amount is 5%, and the latitude in linewidth is ±10% (FIG. 29 shows a change in depth of focus). The FIB dose allowances are $4.5 \times 10^{15}$ ions/cm$^2$ or less, $6 \times 10^{15}$ ions/cm$^2$ or less, $3.5 \times 10^{15}$ ions/cm$^2$ or less, and $6 \times 10^{15}$ ions/cm$^2$ or less, respectively (the thick lines in FIGS. 26 to 29 represent the depths of focus obtained by the pattern transfer experiment).

The second pattern is as follows. That is, the depth of focus obtained by the contrast is always larger than the depth of focus obtained by the linewidth variation. In this case, the FIB dose is determined by the depth of focus obtained by the linewidth variation. The depth of focus obtained by the linewidth variation does not change until a predetermined dose. However, when the dose exceeds the predetermined value, the depth of focus decreases. Therefore, the FIB dose allowance is smaller than a dose at which the depth of focus starts to decrease. This pattern is observed for the above-described 0.275-µm L & S when the latitude in exposure amount is 10%, and the latitude in linewidth is ±5% (FIG. 30 shows a change in depth of focus), and when the latitude in exposure amount is 15%, and the latitude in linewidth is ±10% (FIG. 31 shows a change in depth of focus). The FIB dose allowances are $4.5 \times 10^{15}$ ions/cm$^2$ or less and $3 \times 10^{15}$ ions/cm$^2$ or less, respectively (the thick lines in FIGS. 30 and 31 represent the depths of focus obtained by the transfer experiment).

The third pattern is as follows. That is, the depth of focus obtained by the linewidth variation is always larger than the depth of focus obtained by the contrast. When the mask material is an SiN$_x$ film, the depth of focus obtained by the contrast exhibits constant even when the FIB dose is changed. This is because the transmissivity of the quartz substrate and that of the SiN$_x$ film almost equally decrease with respect to an FIB dose. For some mask materials, both the transmissivity of the quartz substrate and that of the mask material slightly decrease, and the depth of focus obtained by the contrast is constant until a predetermined dose. However, above the predetermined dose the transmissivity of the quartz substrate decreases faster than that of the mask material, and the depth of focus obtained by the contrast decreases as the FIB dose increases. In some cases, the depth of focus obtained by the contrast always becomes smaller than the depth of focus obtained by the linewidth variation depending on the latitude in exposure amount and the latitude in linewidth. In this case, the FIB dose allowance is smaller than a dose at which the depth of focus obtained by the contrast starts to decrease.

In this manner, the total FIB dose allowance is obtained. When a defect is repaired at a dose within the dose allowance, damage generated in the mask can be prevented from adversely affecting the size of the resist pattern formed on the wafer.

In the above description, the mask material is SiN$_x$. However, the mask material is not limited to SiN$_x$. A similar phenomenon is observed when the halftone mask consists of another material (e.g., molybdenum silicide or a molybdenum compound, tungsten silicide or a tungsten silicide compound, chromium or a chromium compound, carbon, or silicon). The depth of focus exhibits a predetermined value until a predetermined FIB dose value and decreases when the dose exceeds the predetermined value, though the value varies depending on the mask material. Therefore, similarly, when the total FIB dose is set to be smaller than a dose at which the depth of focus starts to decrease due to FIB irradiation, damage generated in the mask can be prevented from adversely affecting the size of the resist pattern formed on the wafer. This also applies to a Cr mask.

(11th Embodiment)

In the 11th embodiment, a defect repair system having a function of counting an FIB dose in each repair process will be described.

The repair of a defect is basically performed by recognizing the defect shape and processing the defect. However, when desired processing is to be accurately performed by a routine operation, simple imaging of a region including a defect does not suffice, and various imaging operations are necessary such that a processing position is adjusted, a drift is corrected, or end point detection is performed during processing. For example, for an edge defect, the edge of the processing region must be accurately adjusted, and for this purpose, an edge is designated on the basis of an image obtained first to perform edge detection, thereby adjusting the processing region to the edge. When a drift generated in during processing is to be corrected, imaging of a reference position is performed at a predetermined time interval. If no sufficient signal can be obtained from a signal obtained during processing, and end point detection cannot be performed, imaging for end point detection must be performed independently of processing.

An FIB is also irradiated on the processing region. For this reason, for etching, damage to the processing region, or for deposition, damage to the deposition region must be effectively considered. Since, in etching, the layer in which ions are implanted is removed simultaneously with ion implantation, and since, in film deposition, a film is deposited simultaneously with ion implantation, the ion dose per unit area is different from that in imaging. Therefore, an effective dose is obtained using a transmissivity or the like. Particularly, when a translucent film or a transparent film is to be deposited, an FIB dose for imaging and the effective dose for the film to be deposited are added, so these doses must be taken into consideration.

As the wavelength of exposure light is shortened, the FIB dose allowance becomes smaller. Therefore, it must be predicted prior to a repair or confirmed after the repair whether an FIB can be irradiated at the repair portion upon completion of all processing.

As an example, a case in which a semi-circular bump defect is generated adjacent to an edge will be described below with reference to FIG. 32.

With an inspection apparatus, only simple information representing the positional coordinates of the defect or that the defect is a bump defect or a divot defect can be obtained. First, imaging is performed in a 10-µm square to confirm the presence of the defect. The subsequent repair process changes depending on the type of defect. If the defect is a bump defect at an edge portion, the following repair process is performed. As an example, FIB doses used in the respective processes of this experiment are noted.

First, to confirm the presence of the defect, imaging within a 10-µm square is performed, as described above. The FIB dose at this time is $1 \times 10^{15}$ ions/cm$^2$.

A processing region 73 (a region enclosed by a thick line in FIG. 32) including the defect is set along the pattern edge. The defect is generated at the edge portion. For a purpose of accurately adjusting the edge of the processing region, a region 74 enclosed by a dotted line in FIG. 32 and including the edge is designated on the image obtained first, thereby detecting the edge position. On the basis of the detected edge position, the processing region is moved and set such that the actual edge position of the processing region matches the preset edge position (edge locking). The FIB dose for edge position detection is $1 \times 10^{15}$ ions/cm$^2$.

Since the defect is a bump defect, the defect region must be properly recognized to appropriately remove the defect. To recognize the defect region, a satisfactory image is required, and imaging must be performed again for only the set processing region. The dose at this time is $2 \times 10^{15}$ ions/cm$^2$.

The defect is removed next. Gas assisted etching in which an FIB is irradiated under the concomitant of, e.g., an XeF$_2$ gas to decompose the gas, and etching is progressed by the decomposed fluorine will be described. In the case of etching, ion implantation and removal of ion-implanted layer occur simultaneously due to FIB irradiation, so that the amount of ions remaining on the processed region after repair is not the same as the total FIB dose during processing. Therefore the damage of the processed region should not be estimated from the total dose during processing and should be estimated from the amount of ions remaining in the process region as an effective dose which corresponds to a dose in imaging.

Assume that the dose for defect removal is D [ions/cm$^2$], the etched depth is d [cm], the processed area is S [cm$^2$], the range of ions for the defect material is r [cm]. In the case that the energy of ions is several tens keV, the irradiated ions are implanted to a depth of r. Through the processing, ions are implanted in the range from the depth of r to the depth of d+r in the case that the surface before processing is assumed as the top surface. (Depth is described from the surface before processing hereinafter.) D×S ions are irradiated in the region whose volume is S×d [cm$^3$]. On the other hand, the ion-implanted layer in the range from the depth of 0 to the depth of d is removed. The ions remaining after processing exist in the range from the depth of d to the depth of d+r and the amount of remaining ions are D×S×(S×r)/(S×d)=D×S×r/d. The amount of remaining ions per area is D×r/d [ions/cm$^2$]. The etching rate e [cm$^3$/ion] is d/D. Therefore the amount of remaining ions per area is r/e [ions/cm$^2$].

Etching occurs during imaging, too. But in the case of imaging, the etched depth is smaller than the range of ions. Therefore the amount of removed ions is negligible and the amount of remaining ions after imaging is thought to be the same as the total dose of ions.

As the result, the effective dose which corresponds to a dose in imaging in the processed region is thought to be r/e [ions/cm$^2$].

The range of 30 keV Ga$^+$ions for SiN$_x$ film is 150 Å. The etching rate in the case of gas assisted etching with XeF$_2$ is $4 \times 10^{-22}$ cm$^3$/ion. Therefore the effective dose is $3.8 \times 10^{15}$ ions/cm$^2$, which corresponds to the dose in imaging.

When the total FIB dose upon completion of the repair is to be predicted prior to the repair, actually, the following process can be exemplified. First, imaging is performed to recognize the defect, and the repair process as described above is selected depending on the type of defect. With this processing, the FIB dose in each process is obtained. The effective dose for all the repair processes is preferably displayed.

In this case, the FIB dose upon completion of the repair is $2 \times 10^{15}$ ions/cm$^2$ for the edge region for which imaging for edge locking is performed, $3 \times 10^{15}$ ions/cm$^2$ for an unprocessed portion of the set processing region, $4 \times 10^{15}$ ions/cm$^2$ for the processed region (because the ions implanted during imaging were removed by etching), and $1 \times 10^{15}$ ions/cm$^2$ for other portions.

When the latitude in exposure amount is 10%, and the latitude in linewidth is ±10%, the FIB dose allowance is $5 \times 10^{15}$ ions/cm$^2$. It is confirmed that the FIB dose falls within the allowance in any region.

After it is confirmed that the FIB dose in defect repair processing falls within the allowance, processing is performed in accordance with the above sequence. When a pattern was transferred on a resist by using a repaired mask, the non-defect portion and the repaired portion had the same depth of focus.

In order to confirm that the total FIB dose upon completion of repair falls within the FIB dose allowance, for example, the FIB dose is counted every time each repair process is completed, so that the sum is confirmed finally.

As described above, according to the 10th and 11th embodiments, when the total FIB dose is set to be smaller than a dose at which the depth of focus starts to decrease due to FIB irradiation, the optical image intensity does not change even after a repair, and the transferred pattern of a portion where the defect is repaired is prevented from being degraded.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A mask defect repair system which repairs, by irradiating a particle beam, a defect on a mask made of a transparent substrate and a mask material formed on said substrate, comprising:

imaging beam irradiation means for two-dimensionally scanning and irradiating the particle beam for imaging on a surface of said mask;

detection means for detecting a first intensity distribution of secondary particles emitted from said surface of said mask by irradiation of the particle beam for imaging;

image processing means for performing image processing of at least part of the first intensity distribution of the secondary particles to prepare a second intensity distribution;

image display means for displaying the first and the second intensity distribution as an image composed of a plurality of pixels;

external input means for setting, on the image, a desired region to be processed with the particle beam;

irradiation region determination means for determining, on said desired region to be processed, a particle beam irradiation region on the basis of the second intensity distribution;

repair beam irradiation means for irradiating the particle beam for a defect repair on said particle beam irradiation region; and gas supply means for supplying one of an etching gas and a deposition gas to said surface of said mask.

2. A system according to claim 1, wherein said image processing means performs smoothing processing of the first intensity distribution of the secondary particles to prepare the second intensity distribution.

3. A system according to claim 2, wherein said irradiation region determination means performs one of binarization and multi-valued data making of the second intensity distribution prepared by said image processing means while setting a predetermined threshold value, and recognizes a defect portion in said desired region to be processed, which is set by said external input means, thereby determining said particle beam irradiation region.

4. A system according to claim 2, wherein said irradiation region determination means performs one of binarization and multi-valued data making of the second intensity distribution prepared by said image processing means while setting a predetermined threshold value, recognizes a defect portion in said desired region to be processed, which is set by said external input means, to determine said particle beam irradiation region, and thereafter, chooses, for a boundary portion of said particle beam irradiation region, pixels in the second intensity distribution near the boundary portion on the basis of a predetermined rule, thereby setting a new boundary of said particle beam irradiation region.

5. A system according to claim 2, wherein said irradiation region determination means detects an edge in said desired region to be processed, which is set by said external input means, and chooses pixels in the second intensity distribution of the secondary particles near said edge on the basis of a predetermined rule, thereby setting a boundary of said beam irradiation region, and said external input means designates a region on one side of the boundary, thereby designating said particle beam irradiation region.

6. A system according to claim 1, wherein said imaging beam irradiation means performs irradiation of the particle beam for imaging at a dose smaller than that at which a secondary particle intensity for said transparent substrate equals that for said mask material.

7. A system according to claim 1, further comprising integration means for dividing said region to be processed with the particle beam into small regions each corresponding to some of said plurality of pixels and integrating, for a predetermined time, secondary particle intensities obtained when the particle beam for the defect repair is being irradiated on said small regions, wherein said repair beam irradiation means stops irradiation of the particle beam for the defect repair to said small regions when integration results obtained by said integration means reaches a predetermined ratio of a predetermined intensity.

8. A system according to claim 1, further comprising arithmetic means for performing image processing of the secondary particle intensities obtained by irradiating the particle beam for the defect repair to prepare a file of a third intensity distribution, and integration means for integrating secondary particle intensities to prepare an integration file, wherein said repair beam irradiation means stops irradiation of the particle beam for the defect repair to small regions obtained by dividing said region to be processed with the particle beam to some of said plurality of pixels when integration results in terms of said small regions obtained by said integration means on the basis of said file of said third intensity distribution prepared by said arithmetic means or an arithmetic results in terms of said small regions obtained by said arithmetic means on the basis of said integration file prepared by said integration means reach a predetermined ratio of a predetermined intensity.

9. A system according to claim 1, wherein said image processing means uses a filter, said imaging beam irradiation means irradiates the particle beam on an enlarged irradiation region enclosed by a line separated from an edge of said desired region to be processed by at least a distance corresponding to a radius of said filter, and said detection means detects the first intensity distribution of the secondary particles for said enlarged irradiation region.

10. A system according to claim 1, wherein said image processing means corrects a drift of the image generated during image processing by detecting a variation from an initial position of an edge of said mask material, which is detected as saturation points of a secondary particle intensity.

11. A mask defect repair system which repairs, by irradiating a particle beam, a defect on a mask made of a transparent substrate and a mask material formed on said substrate, comprising:

imaging beam irradiation means for two-dimensionally scanning and irradiating the particle beam for imaging on a surface of said mask;

detection means for detecting an intensity distribution of secondary particles emitted by irradiation of the particle beam for imaging;

image display means for displaying the intensity distribution of the secondary particles as an image;

external input means for setting, on the image, a desired region to be processed with the particle beam;

irradiation region determination means for determining, on said desired region, a particle beam irradiation region on the basis of the intensity distribution of the secondary particles;

repair beam irradiation means for irradiating the particle beam for a defect repair on said particle beam irradiation region; and gas supply means for supplying one of an etching gas and a deposition gas to said surface of said mask, wherein said irradiation region determination means predicts a shape of a defect edge on the basis of the number of continuous pixels which exhibit a secondary particle intensity not lower than a predetermined level, thereby determining a beam irradiation region and a beam irradiation condition.

12. A mask defect repair system which repairs, by irradiating a particle beam, a defect on a mask made of a transparent substrate and a mask material formed on said substrate, comprising:

imaging beam irradiation means for two-dimensionally scanning and irradiating the particle beam for imaging on a surface of said mask;

detection means for detecting an intensity distribution of secondary particles emitted by irradiation of the particle beam for imaging;

image display means for displaying the intensity distribution of the secondary particles as an image;

external input means for setting, on the image, a desired region to be processed with the particle beam;

irradiation region determination means for determining, on said desired region, a particle beam irradiation region on the basis of the intensity distribution of the secondary particles;

repair beam irradiation means for irradiating the particle beam for a defect repair on said particle beam irradiation region;

gas supply means for supplying one of an etching gas and a deposition gas to said surface of said mask; and dose count means for counting a dose of the particle beam for imaging and an effective dose of the particle beam for the defect repair in terms of the processed area.

13. A system according to claim 12, wherein said dose count means estimates the effective dose of the particle beam for the defect repair from an equation:

$$q = r/e \, (\text{ions/cm}^2)$$

where q is the effective does, r(cm) is an implanting range of ions for a material of the defect, and e(cm$^3$/ion) is an etching rate.

* * * * *